United States Patent
Xu et al.

(10) Patent No.: US 10,997,936 B2
(45) Date of Patent: May 4, 2021

(54) SHIFT REGISTER UNIT, GATE DRIVE CIRCUIT AND DISPLAY DEVICE

(71) Applicant: BOE TECHNOLOGY GROUP CO., LTD., Beijing (CN)

(72) Inventors: Chen Xu, Beijing (CN); Xueguang Hao, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/475,473

(22) PCT Filed: Jan. 10, 2019

(86) PCT No.: PCT/CN2019/071186
§ 371 (c)(1),
(2) Date: Jul. 2, 2019

(87) PCT Pub. No.: WO2019/205745
PCT Pub. Date: Oct. 31, 2019

(65) Prior Publication Data
US 2020/0294461 A1    Sep. 17, 2020

(30) Foreign Application Priority Data
Apr. 28, 2018   (CN) .......................... 201820630007.5

(51) Int. Cl.
*G09G 3/36*    (2006.01)
*G11C 19/28*    (2006.01)

(52) U.S. Cl.
CPC ........... *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS 10,217,427 B2   2/2019   Zhang et al.
10,319,325 B2   6/2019   Xu
(Continued)

FOREIGN PATENT DOCUMENTS

CN   103489483 A   1/2014
CN   104167192 A   11/2014
(Continued)

OTHER PUBLICATIONS

Australia First Examination Report dated Aug. 31, 2020; Appln. No. 2019259412.

*Primary Examiner* — Ifedayo B Iluyomade

(57) ABSTRACT

A shift register unit, a gate drive circuit and a display device are disclosed. The shift register unit includes an input circuit, an output circuit, a reset circuit, a control circuit and a reset stabilizing circuit. The input circuit is configured to write an input signal into a first node in response to an input start signal. The output circuit is configured to output a preparatory output signal to an output terminal under control of an electric level of the first node. The reset circuit is configured to reset the output terminal under control of an electric level of a second node. The control circuit is configured to apply a first voltage signal to the second node in response to a control signal. The reset stabilizing circuit is configured to apply a second voltage signal to the first node in response to a reset stabilizing signal.

19 Claims, 8 Drawing Sheets

(56) References Cited

U.S. PATENT DOCUMENTS

| | | | |
|---|---|---|---|
| 2011/0057926 A1* | 3/2011 | Shang | G11C 19/28 345/213 |
| 2014/0043304 A1 | 2/2014 | Yamashita | |
| 2014/0133621 A1 | 5/2014 | Shang | |
| 2015/0243367 A1 | 8/2015 | Gu et al. | |
| 2016/0172054 A1 | 6/2016 | Shao et al. | |
| 2016/0351156 A1* | 12/2016 | Wu | G09G 3/3677 |

FOREIGN PATENT DOCUMENTS

| | | |
|---|---|---|
| CN | 104392704 A | 3/2015 |
| CN | 105096904 A | 11/2015 |
| CN | 105845183 A | 8/2016 |
| CN | 106601178 A | 4/2017 |
| CN | 208141796 U | 11/2018 |

\* cited by examiner

SHIFT REGISTER UNIT, GATE DRIVE CIRCUIT AND DISPLAY DEVICE

CROSS REFERENCE TO RELATED APPLICATIONS

The present application claims priority to Chinese patent application No. 201820630007.5, filed on Apr. 28, 2018, the entire disclosure of which is incorporated herein by reference as part of the present application.

TECHNICAL FIELD

Embodiments of the present disclosure relate to a shift register unit, a gate drive circuit and a display device.

BACKGROUND

In the field of display technology, for example, a pixel array of a liquid crystal display (LCD) panel generally includes a plurality of rows of gate lines and includes a plurality of columns of data lines that intersect the plurality of rows of gate lines. The driving of the gate lines can be achieved by a bonded integrated drive circuit. In recent years, with the continuous improvement of the manufacturing process of amorphous silicon thin-film transistors (a-Si TFTs) or oxide thin-film transistors, a gate drive circuit can be directly integrated on a TFT array substrate to form a gate driver on array (GOA) to drive the gate lines. For example, a GOA formed of a plurality of cascaded shift register units can be used to provide turning-on and turning-off voltage signals for the plurality of rows of gate lines of the pixel array, thereby, for example, controlling the plurality of rows of gate lines to be sequentially switched on; and meanwhile, the data lines provide data signals for pixel units in corresponding rows of the pixel array, so as to form grey-scale voltages, for grey-scales of a displayed image, at the pixel units, such that a frame of the image can be displayed. For current display panels, the using of GOA technology to drive the gate lines are increasingly. The GOA technology helps realizing narrow bezel and can reduce the production cost.

SUMMARY

At least one embodiment provides a shift register unit, which comprises: an input circuit, an output circuit, a reset circuit, a control circuit and a reset stabilizing circuit. The input circuit is configured to write an input signal into a first node in response to an input start signal; the output circuit is configured to output a preparatory output signal to an output terminal under control of an electric level of the first node; the reset circuit is configured to reset the output terminal under control of an electric level of a second node; the control circuit is configured to apply a first voltage signal to the second node in response to a control signal; the reset stabilizing circuit is configured to apply a second voltage signal to the first node in response to a reset stabilizing signal.

For example, in the shift register unit provided by some embodiment of the present disclosure, the reset stabilizing circuit comprises a first transistor and a second transistor, and the reset stabilizing signal comprises a first reset stabilizing signal and a second reset stabilizing signal; a gate electrode of the first transistor is configured to be connected with the second node to take the electric level of the second node as the first reset stabilizing signal, a first terminal of the first transistor is configured to be connected with a first clock signal line to receive a first clock signal as the second reset stabilizing signal, and a second terminal of the first transistor is configured to be connected with a gate electrode of the second transistor; a first terminal of the second transistor is configured to be connected with a second voltage terminal to receive the second voltage signal, and a second terminal of the second transistor is configured to be connected with the first node.

For example, in the shift register unit provided by some embodiment of the present disclosure, the reset stabilizing circuit comprises a third transistor and a fourth transistor, and the reset stabilizing signal comprises a first reset stabilizing signal and a second reset stabilizing signal; a gate electrode of the third transistor is configured to be connected with the second node to take the electric level of the second node as the first reset stabilizing signal, a first terminal of the third transistor is configured to be connected with a second voltage terminal to receive the second voltage signal, and a second terminal of the third transistor is configured to be connected with a first terminal of the fourth transistor; a gate electrode of the fourth transistor is configured to be connected with a first clock signal line to receive a first clock signal as the second reset stabilizing signal, and a second terminal of the fourth transistor is configured to be connected with the first node.

For example, in the shift register unit provided by some embodiment of the present disclosure, the input circuit comprises a fifth transistor; and a gate electrode of the fifth transistor is configured to be connected with a second clock signal line to receive a second clock signal as the input start signal, a first terminal of the fifth transistor is configured to be connected with an input signal line to receive the input signal, and a second terminal of the fifth transistor is configured to be connected with the first node.

For example, in the shift register unit provided by some embodiment of the present disclosure, the output circuit comprises a sixth transistor and a first capacitor; a gate electrode of the sixth transistor is configured to be connected with the first node, a first terminal of the sixth transistor is configured to be connected with a first clock signal line to receive a first clock signal as the preparatory output signal, and a second terminal of the sixth transistor is taken as the output terminal; a first electrode of the first capacitor is configured to be connected with the gate electrode of the sixth transistor, and a second electrode of the first capacitor is configured to be connected with the second terminal of the sixth transistor.

For example, in the shift register unit provided by some embodiment of the present disclosure, the reset circuit comprises a seventh transistor and a second capacitor; a gate electrode of the seventh transistor is configured to be connected with the second node, a first terminal of the seventh transistor is configured to be connected with a second voltage terminal to receive the second voltage signal, and a second terminal of the seventh transistor is configured to be connected with the output terminal; a first electrode of the second capacitor is configured to be connected with the gate electrode of the seventh transistor, and a second electrode of the second capacitor is configured to be connected with the first terminal of the seventh transistor.

For example, in the shift register unit provided by some embodiment of the present disclosure, the control circuit comprises an eighth transistor and a ninth transistor, and the control signal comprises a first control signal and a second control signal; a gate electrode of the eighth transistor is configured to be connected with a second clock signal line to receive a second clock signal as the first control signal, a first terminal of the eighth transistor is configured to be connected with a first voltage terminal to receive the first voltage signal, and a second terminal of the eighth transistor is configured to be connected with the second node; a gate electrode of the ninth transistor is configured to be connected with the input circuit to receive the input signal inputted from the input circuit and take the input signal as the second control signal, a first terminal of the ninth transistor is configured to be connected with the second clock signal line to receive the second clock signal, and a second terminal of the ninth transistor is configured to be connected with the second terminal of the eighth transistor.

For example, the shift register unit provided by some embodiment further comprises an output stabilizing circuit. The output stabilizing circuit is configured to be switched on or off, according to a change in an electrical level of a signal outputted by the output terminal, under control of the first voltage signal.

For example, in the shift register unit provided by some embodiment of the present disclosure, the output stabilizing circuit comprises a tenth transistor; a gate electrode of the tenth transistor is configured to be connected with a first voltage terminal to receive the first voltage signal, a first terminal of the tenth transistor is configured to be connected with the input circuit and the reset stabilizing circuit, and a second terminal of the tenth transistor is configured to be connected with the first node.

For example, in the shift register unit provided by some embodiment of the present disclosure, transistors are P-type transistors, and a material of an active layer of each of the P-type transistors comprises low-temperature polysilicon.

For example, in the shift register unit provided by some embodiment of the present disclosure, the transistors are P-type transistors; a material of an active layer of each of the P-type transistors comprises low-temperature polysilicon; the output stabilizing circuit comprises an output stabilizing transistor, a gate electrode of the output stabilizing transistor is configured to be connected with a second voltage terminal to receive the second voltage signal, a first terminal of the output stabilizing transistor is configured to be connected with the input circuit and the reset stabilizing circuit, and a second terminal of the output stabilizing transistor is configured to be connected with the first node; and the output stabilizing transistor is an N-type transistor, and a material of an active layer of the N-type transistor comprises an oxide.

For example, in the shift register unit provided by some embodiment of the present disclosure, when the control circuit comprises a ninth transistor and the output stabilizing circuit comprises a tenth transistor, the ninth transistor and the tenth transistor are dual-gate thin-film transistors; or when the control circuit comprises a ninth transistor and the output stabilizing circuit comprises an output stabilizing transistor, the ninth transistor and the output stabilizing transistor are dual-gate thin-film transistors.

At least one embodiment further provides a shift register unit, which comprises: an eleventh transistor, in which a gate electrode of the eleventh transistor is configured to be connected with a first node, a first terminal of the eleventh transistor is configured to be connected with a first clock signal line to receive a first clock signal, and a second terminal of the eleventh transistor is configured to be connected with an output terminal; a third capacitor, in which a first electrode of the third capacitor is configured to be connected with the gate electrode of the eleventh transistor, and a second electrode of the third capacitor is configured to be connected with the second terminal of the eleventh transistor; a twelfth transistor, in which a gate electrode of the twelfth transistor is configured to be connected with a first voltage terminal to receive a first voltage signal, the twelfth transistor further comprises a first terminal and a second terminal, and the second terminal of the twelfth transistor is configured to be connected with the first node; a thirteenth transistor, in which a gate electrode of the thirteenth transistor is configured to be connected with a second clock signal to receive a second clock signal, a first terminal of the thirteenth transistor is configured to be connected with an input terminal to receive an input signal, and a second terminal of the thirteenth transistor is configured to be connected with the first terminal of the twelfth transistor; a fourteenth transistor, in which a gate electrode of the fourteenth transistor is configured to be connected with a second node, a first terminal of the fourteenth transistor is configured to be connected with a second voltage terminal to receive a second voltage signal, and a second terminal of the fourteenth transistor is configured to be connected with the second terminal of the eleventh transistor; a fourth capacitor, in which a first electrode of the fourth capacitor is configured to be connected with the gate electrode of the fourteenth transistor, and a second electrode of the fourth capacitor is configured to be connected with the first terminal of the fourteenth transistor; a fifteenth transistor, in which a gate electrode of the fifteenth transistor is configured to be connected with the second node, and a first terminal of the fifteenth transistor is configured to be connected with the first clock signal line to receive the first clock signal; a sixteenth transistor, in which a gate electrode of the sixteenth transistor is configured to be connected with the second terminal of the fifteenth transistor, a first terminal of the sixteenth transistor is configured to be connected with the second voltage terminal to receive the second voltage signal, and a second terminal of the sixteenth transistor is configured to be connected with the first terminal of the twelfth transistor; a seventeenth transistor, in which a gate electrode of the seventeenth transistor is configured to be connected with the second clock signal line to receive the second clock signal, a first terminal of the seventeenth transistor is configured to be connected with the first voltage terminal to receive the first voltage signal, and a second terminal of the seventeenth transistor is configured to be connected with the second node; and an eighteenth transistor, in which a gate electrode of the eighteenth transistor is configured to be connected with the second terminal of the thirteenth transistor, a first terminal of the eighteenth transistor is configured to be connected with the second clock signal line to receive the second clock signal, and a second terminal of the eighteenth transistor is configured to be connected with the second node.

At least one embodiment further provides a shift register unit, which comprises: a nineteenth transistor, in which a gate electrode of the nineteenth transistor is configured to be connected with a first node, a first terminal of the nineteenth transistor is configured to be connected with a first clock signal line to receive a first clock signal, and a second terminal of the nineteenth transistor is configured to be connected with an output terminal; a fifth capacitor, in which a first electrode of the fifth capacitor is configured to be connected with the gate electrode of the nineteenth transistor, and a second electrode of the fifth capacitor is configured to be connected with the second terminal of the nineteenth transistor; a twentieth transistor, in which a gate electrode of the twentieth transistor is configured to be connected with a first voltage terminal to receive a first voltage signal, the twentieth transistor further comprises a first terminal and a second terminal, and the second terminal of the twentieth transistor is configured to be connected with the first node; a twenty-first transistor, in which a gate electrode of the twenty-first transistor is configured to be connected with a second clock signal line to receive a second clock signal, a first terminal of the twenty-first transistor is configured to be connected with an input terminal to receive an input signal, and a second terminal of the twenty-first transistor is configured to be connected with the first terminal of the twentieth transistor; a twenty-second transistor, in which a gate electrode of the twenty-second transistor is configured to be connected with a second node, a first terminal of the twenty-second transistor is configured to be connected with a second voltage terminal to receive a second voltage signal, and a second terminal of the twenty-second transistor is configured to be connected with the second terminal of the nineteenth transistor; a sixth capacitor, in which a first electrode of the sixth capacitor is configured to be connected with the gate electrode of the twenty-second transistor, and a second electrode of the sixth capacitor is configured to be connected with the first terminal of the twenty-second transistor; a twenty-third transistor, in which a gate electrode of the twenty-third transistor is configured to be connected with the second node, and a first terminal of the twenty-third transistor is configured to be connected with the second voltage terminal to receive the second voltage signal; a twenty-fourth transistor, in which a gate electrode of the twenty-fourth transistor is configured to be connected with the first clock signal line to receive the first clock signal, a first terminal of the twenty-fourth transistor is configured to be connected with the second terminal of the twenty-third transistor, and a second terminal of the twenty-fourth transistor is configured to be connected with the first terminal of the twentieth transistor; a twenty-fifth transistor, in which a gate electrode of the twenty-fifth transistor is configured to be connected with the second clock signal line to receive the second clock signal, a first terminal of the twenty-fifth transistor is configured to be connected with the first voltage terminal to receive the first voltage signal, and a second terminal of the twenty-fifth transistor is configured to be connected with the second node; and a twenty-sixth transistor, in which a gate electrode of the twenty-sixth transistor is configured to be connected with the second terminal of the twenty-first transistor, a first terminal of the twenty-sixth transistor is configured to be connected with the second clock signal line to receive the second clock signal, and a second terminal of the twenty-sixth transistor is configured to be connected with the second node.

At least one embodiment further provides a gate drive circuit, which comprises a plurality of shift register units that are cascaded. The plurality of shift register units comprise P first shift register units, each of the first shift register units adopts the shift register unit provided by any embodiment of the present disclosure, and P is an integer greater than one.

At least one embodiment further provides a display device, which comprises the gate drive circuit provided by any embodiment of the present disclosure.

For example, in the shift register unit provided by some embodiment of the present disclosure, the display device further comprises a plurality of scanning lines and a plurality of pixel units arranged in a plurality of rows. The plurality of scanning lines are correspondingly connected with the plurality of rows of pixel units; output terminals of the plurality of shift register units in the gate drive circuit are correspondingly connected with the plurality of scanning lines; and an output terminal of a shift register unit at (N)th stage is further connected with an input circuit of a shift register unit at (N+1)th stage to provide an input signal, and N is an integer greater than zero.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
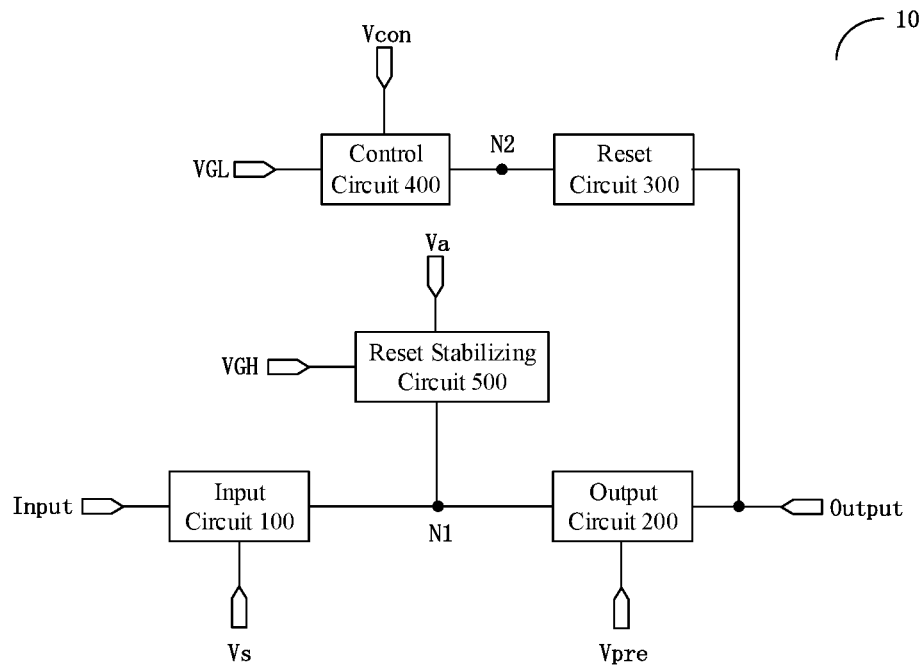
FIG. 1 is a schematic block diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A GOA circuit, for example, includes a plurality of TFTs. The inventors of the present disclosure have noted in the study that the TFTs may have leakage phenomenon because of factors such as the material characteristics and the manufacturing processes, such that an output signal of the GOA circuit have poor stability and can be easily interfered by other signals. The inventors of the present disclosure have also noted in the study that other factors such as the mutual coupling of the components in the GOA circuit, poor electromagnetic compatibility, circuit structure can also cause problems such as poor stability of the output signal. The above-mentioned problems may affect the display effect of the display panel and reduce the display quality.

At least one embodiment of the present disclosure provides a shift register unit, a gate drive circuit and a display device. In some examples, the shift register unit can improve the stability of the output signal, prevent the output signal from being interfered by other signals, and improve the display quality of the display device adopting the gate drive circuit employing the shift register unit.

Detailed description will be given below to the embodiment of the present disclosure with reference to the accompanying drawings. It should be noted that same reference numerals in different drawings are used to refer to the same components that have been described.

At least one embodiment provides a shift register unit, which comprises: an input circuit, an output circuit, a reset circuit, a control circuit and a reset stabilizing circuit. The input circuit is configured to write an input signal into a first node in response to an input start signal; the output circuit is configured to output a preparatory output signal to an output terminal under control of an electric level of the first node; the reset circuit is configured to reset the output terminal under control of an electric level of a second node; the control circuit is configured to apply a first voltage signal to the second node in response to a control signal; the reset stabilizing circuit is configured to apply a second voltage signal to the first node in response to a reset stabilizing signal.

FIG. 1 is a schematic block diagram of a shift register unit provided by some embodiments of the present disclosure. As illustrated in FIG. 1, the shift register unit 10 comprises an input circuit 100, an output circuit 200, a reset circuit 300, a control circuit 400 and a reset stabilizing circuit 500.

The input circuit 100 is configured to write an input signal into a first node N1 in response to an input start signal. For example, the input circuit 100 may be connected with an input terminal Input and an input start terminal Vs and the input circuit 100 is configured to electrically connect the first node N1 and the input terminal Input under the control of the input start signal provided by the input start terminal Vs, so as to write the input signal provided by the input terminal Input into the first node N1. Thus, when the input signal is at a valid electric level (the electric level for switching on a corresponding switching element, e.g., low electric level), the electric level of the first node N1 is also a valid electric level, so as to control the output circuit 200 to be switched on. Of course, embodiments of the present disclosure are not limited thereto. For example, in other examples, the input start signal and the input signal may be the same signal, namely the input terminal Input and the input start terminal Vs are connected to the same signal line.

The output circuit 200 is configured to output a preparatory output signal to an output terminal Output under the control of the electric level of the first node N1, and take the preparatory output signal as an output signal of the shift register unit 10, so as to drive, for example, gate lines connected with the output terminal Output. For example, the output circuit 200 may be connected with a preparatory output terminal Vpre and the output circuit 200 is configured to be switched on under the control of the electric level of the first node N1, so as to electrically connect the preparatory output terminal Vpre and the output terminal Output, output the preparatory output signal provided by the preparatory output terminal Vpre to the output terminal Output and take the preparatory output signal as a scanning signal outputted by the shift register unit 10.

The reset circuit 300 is configured to reset the output terminal Output under the control of the electric level of a second node N2. For example, the reset circuit 300 may be connected with the output terminal Output and the reset circuit 300 is configured to electrically connect a reset voltage terminal and the output terminal Output under the control of the electric level of the second node N2, so as to apply a reset voltage to the output terminal Output for reset. For example, an electric level signal of the second node N2 is taken as a reset signal, so the shift register unit 10 does not require an additional reset signal, and then the circuit structure is simplified. For example, the reset voltage terminal is connected with the reset circuit 300 and may be, for example, a high voltage terminal.

The control circuit 400 is configured to apply a first voltage signal to the second node N2 in response to a control signal. For example, the control circuit 400 may be connected with a control terminal Vcon and a first voltage terminal VGL and the control circuit 400 is configured to electrically connect the second node N2 and the first voltage terminal VGL under the control of a control signal provided by the control terminal Vcon, so as to write the first voltage signal provided by the first voltage terminal VGL into the second node N2 and control the reset circuit 300 to be switched on. It should be noted that the first voltage terminal VGL, for example, may be configured to keep inputting a direct-current signal with a low electric level. The following embodiments are the same in this respect, so no further description will be given here.

The reset stabilizing circuit 500 is configured to apply a second voltage signal to the first node N1 in response to a reset stabilizing signal. For example, the reset stabilizing circuit 500 may be connected with a reset stabilizing terminal Va and a second voltage terminal VGH and the reset stabilizing circuit 500 is configured to electrically connect the first node N1 and the second voltage terminal VGH under the control of the reset stabilizing signal provided by the reset stabilizing terminal Va, so as to apply the second voltage signal provided by the second voltage terminal VGH to the first node N1, intermittently charge the first node N1 in a reset hold period and subsequent periods, and make sure the output circuit 200 is disconnected. It should be noted that the second voltage terminal VGH, for example, may be configured to keep inputting a direct-current signal with a high electric level. The following embodiments are the same in this respect, so no further description will be given here. For example, the intensity of the signal provided by the second voltage terminal VGH is greater than the intensity of the signal provided by the first voltage terminal VGL. For example, the second voltage terminal VGH may be taken as a reset voltage terminal to provide a reset voltage.

For example, by allowing the reset stabilizing circuit 500 to intermittently charge the first node N1 in the reset hold period and the subsequent periods, and to ensure that the output circuit 200 to be disconnected, it can be avoided that the reduced display quality or the abnormal display of the display device employing the shift register unit 10 when the output signal of the output terminal Output is interfered by other signals, such that the stability of the output signal is improved, and the display quality of the display device employing the shift register unit 10 is improved. For example, the first node N1 is charged to make sure the output circuit 200 is disconnected, and in this case, the reset circuit 300 carries out output, and the reset circuit 300 outputs the reset voltage (e.g., high voltage) to the output terminal Output, thereby preventing the output signal of the output terminal Output from being interfered by the preparatory output signal.

Figure 2:
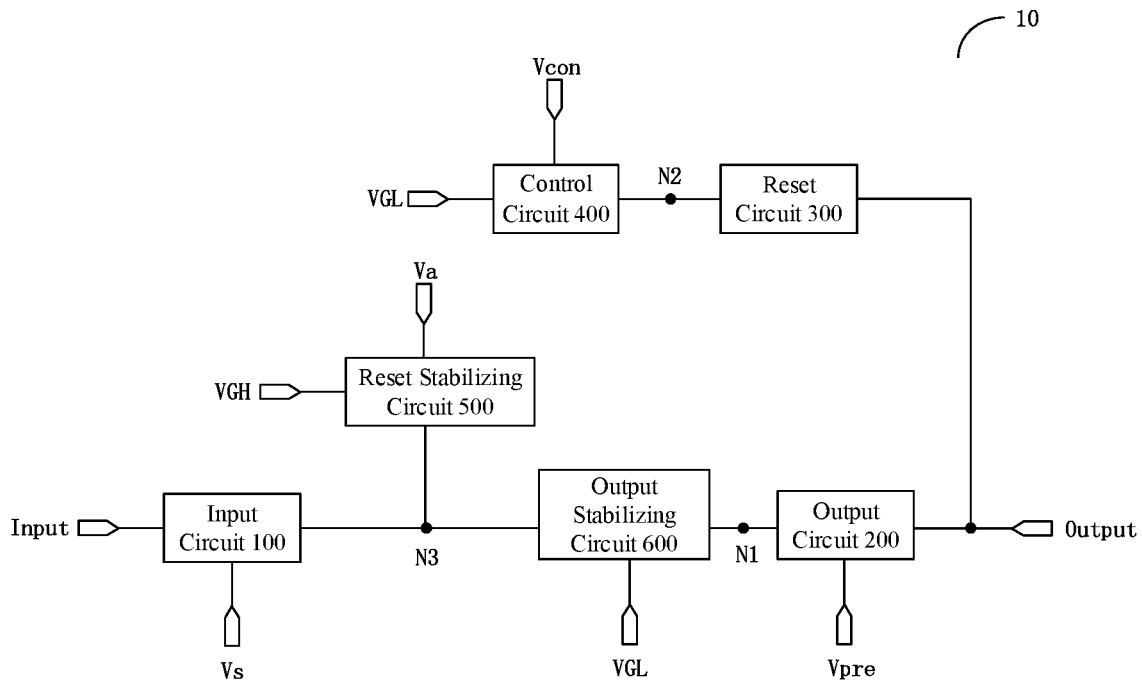
FIG. 2 is a schematic block diagram of another shift register unit provided by some embodiments of the present disclosure.

FIG. 2 is a schematic block diagram of another shift register unit provided by some embodiments of the present disclosure. As illustrated in FIG. 2, the shift register unit 10 further comprises an output stabilizing circuit 600, and other structures are substantially the same with those in the shift register unit 10 as illustrated in FIG. 1.

The output stabilizing circuit 600 is configured to be switched on or switched off according to the change of the electric level of the signal at the output terminal Output under the control of the first voltage signal. For example, the output stabilizing circuit 600 may be connected with the first voltage terminal VGL and connected with the input circuit 100, the output circuit 200 and the reset stabilizing circuit 500 (the output stabilizing circuit 600 is connected with the first node N1 and a third node N3). For example, the output stabilizing circuit 600 is switched on under the control of the first voltage signal provided by the first voltage terminal VGL, namely the first node N1 and the third node N3 are electrically connected, so that the input signal from the input circuit 100 or the second voltage signal from the reset stabilizing circuit 500 can be written into the first node N1. When the output signal of the output terminal Output is changed from a high electric level to a low electric level, the output stabilizing circuit 600 may be switched off according to the change in the electric level of the output signal, namely the first node N1 and the third node N3 are disconnected, and the first node N1 is in a floating state, thereby reducing the leakage of the first node N1, ensuring that the output circuit 200 is switched on, avoiding the reduced display quality or the abnormal display of the display device employing the shift register unit 10 when the output signal of the output terminal Output is interfered by other signals, improving the stability of the output signal, and improving the display quality of the display device employing the shift register unit 10.

It should be noted that the first voltage terminal VGL in the embodiment of the present disclosure, for example, keeps inputting a direct-current signal with a low electric level, and the direct-current signal with a low electric level is referred to as first voltage; and the second voltage terminal VGH, for example, keeps inputting a direct-current signal with a high electric level, and the direct-current signal with a high electric level is referred to as second voltage. The following embodiments are the same in this respect and are not described again. For example, the voltage value of the second voltage is greater than the voltage value of the first voltage.

Figure 3:
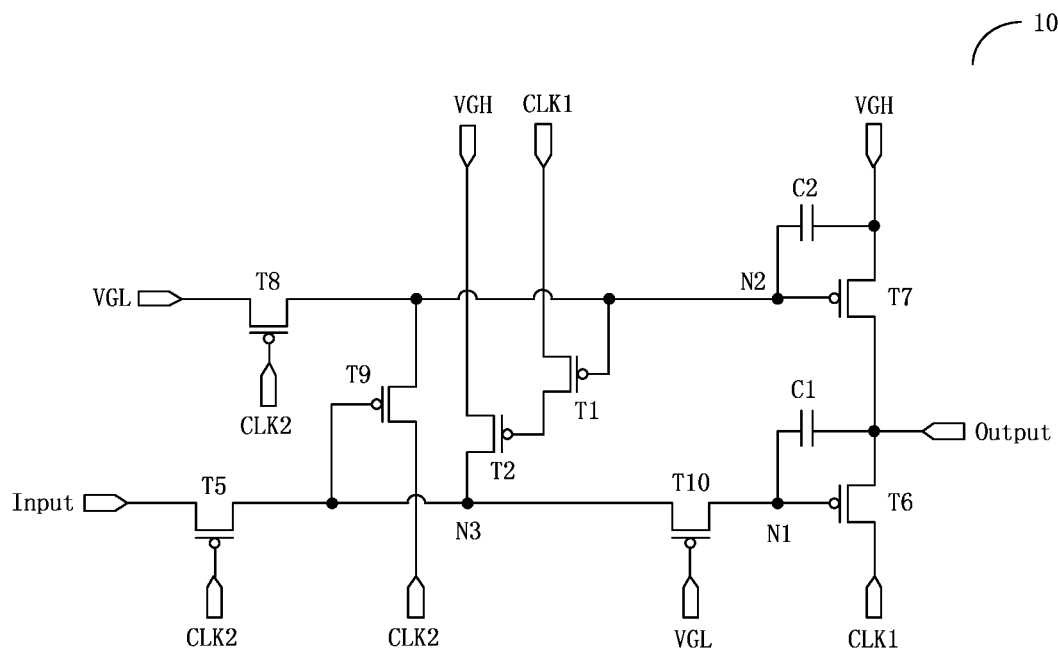
FIG. 3 is a circuit diagram of a specific implementation example of the shift register unit as illustrated in FIG. 2.

FIG. 3 is a circuit diagram of a specific implementation example of the shift register unit as illustrated in FIG. 2. Description will be given in the following description by taking the case where the transistors are P-type transistors as an example, which should not be construed as a limitation on the embodiments of the present disclosure. As illustrated in FIG. 3, the shift register unit 10 comprises a first transistor T1, a second transistor T2, and fifth to tenth transistors T5-T10, and further comprises a first capacitor C1 and a second capacitor C2.

For example, as illustrated in FIG. 3, in more detail, the reset stabilizing circuit 500 may be implemented as the first transistor T1 and the second transistor T2. In this embodiment, the reset stabilizing signal includes two signals, namely a first reset stabilizing signal and a second reset stabilizing signal. A gate electrode of the first transistor T1 is configured to be connected with a second node N2 to take the electric level of the second node N2 as the first reset stabilizing signal; a first terminal of the first transistor T1 is configured to be connected with a first clock signal line CLK1 to receive a first clock signal and take the first clock signal as the second reset stabilizing signal; and a second terminal of the first transistor T1 is configured to be connected with a gate electrode of the second transistor T2. A first terminal of the second transistor T2 is configured to be connected with a second voltage terminal VGH to receive a second voltage signal, and a second terminal of the second transistor T2 is configured to be connected with a third node N3 (it should be noted that when the tenth transistor T10 is switched on, it is equivalent that the second terminal of the second transistor T2 is directly connected to the first node N1). It should be noted that in the embodiment of the present disclosure, the reset stabilizing circuit 500 may also be a circuit formed of other components (for example, the connection mode of a third transistor T3 and a fourth transistor T4 as described below). No limitation will be given here in the embodiment of the present disclosure.

When the electric level of the second node N2 is a valid electric level (for example, low electric level) and the first clock signal is also at a valid electric level, both the first transistor T1 and the second transistor T2 are switched on, so as to apply the second voltage signal to the third node N3 and the first node N1 (in this case, the tenth transistor T10 is switched on) to charge the first node N1, thereby ensuring that the output circuit 200 is disconnected. In this case, the reset circuit 300 outputs the second voltage signal (high electric level) at the second voltage terminal VGH to the output terminal Output. By adoption of this arrangements, the stability of the voltage outputted by the output terminal can be improved.

The input circuit 100 may be implemented as the fifth transistor T5. A gate electrode of the fifth transistor T5 is configured to be connected with a second clock signal line CLK2 to receive a second clock signal as an input start signal; a first terminal of the fifth transistor T5 is configured to be connected with an input signal line (an input terminal Input) to receive an input signal; and a second terminal of the fifth transistor T5 is configured to be connected with the third node N3 (it should be noted that when the tenth transistor T10 is switched on, the second terminal of the fifth transistor T5 is equivalent to be directly connected to the first node N1). When the second clock signal is at a valid electric level, the fifth transistor T5 is switched on, so as to write the input signal into the third node N3 and the first node N1. It should be noted that the input circuit 100 is not limited to this case, and the input circuit 100 may also be a circuit formed of other components to realize corresponding functions.

The output circuit 200 may be implemented as the sixth transistor T6 and the first capacitor C1. A gate electrode of the sixth transistor T6 is configured to be connected with the first node N1; a first terminal of the sixth transistor T6 is configured to be connected with the first clock signal line CLK1 to receive the first clock signal as a preparatory output signal; and a second terminal of the sixth transistor T6 is taken as the output terminal Output or electrically connected with the output terminal Output. A first electrode of the first capacitor C1 is configured to be connected with the gate electrode (the first node ND of the sixth transistor T6, and a second electrode of the first capacitor C1 is configured to be connected with the second terminal (namely the output terminal Output) of the sixth transistor T6. When the electric level of the first node N1 is a valid electric level, the sixth transistor T6 is switched on, so as to output the first clock signal to the output terminal Output. It should be noted that the output circuit 200 is not limited to this case, and the output circuit 200 may also be a circuit formed of other components to realize corresponding functions.

The reset circuit 300 may be implemented as the seventh transistor T7 and the second capacitor C2. A gate electrode of the seventh transistor T7 is configured to be connected with the second node N2; a first terminal of the seventh transistor T7 is configured to be connected with the second voltage terminal VGH to receive the second voltage signal; and a second terminal of the seventh transistor T7 is configured to be connected with the output terminal Output. A first electrode of the second capacitor C2 is configured to be connected with the gate electrode (the second node N2) of the seventh transistor T7, and a second electrode of the second capacitor C2 is configured to be connected with the first terminal of the seventh transistor T7 and the second voltage terminal VGH. When the electric level of the second node N2 is a valid electric level, the seventh transistor T7 is switched on, so as to apply the second voltage signal to the output terminal Output to realize reset. The arrangement of the second capacitor C2 helps stabilizing the voltage of the second node N2, so as to better control the seventh transistor T7. It should be noted that the reset circuit 300 is not limited to this case, and the reset circuit 300 may also be a circuit formed of other components to realize corresponding functions.

The control circuit 400 may be implemented as the eighth transistor T8 and the ninth transistor T9. In the embodiment, the control signal includes two signals, namely a first control signal and a second control signal. A gate electrode of the eighth transistor T8 is configured to be connected with the second clock signal line CLK2 to receive the second clock signal and take the second clock signal as the first control signal; a first terminal of the eighth transistor T8 is configured to be connected with the first voltage terminal VGL to receive the first voltage signal; and a second terminal of the eighth transistor T8 is configured to be connected with the second node N2. A gate electrode of the ninth transistor T9 is configured to be connected with the input circuit 100 (which is the fifth transistor T5 here) to receive the input signal (which is the signal at the third node N3 here) inputted by the input circuit 100 and take the input signal as the second control signal; a first terminal of the ninth transistor T9 is configured to be connected with the second clock signal line CLK2 to receive the second clock signal; and a second terminal of the ninth transistor T9 is configured to be connected with the second terminal of the eighth transistor T8. When the second clock signal is at a valid electric level for switching on a switching element (which is the eighth transistor T8 here) receiving the second clock signal, the eighth transistor T8 is switched on, so as to write the first voltage signal into the second node N2. When the electric level of the third node N3 is a valid electric level, the ninth transistor T9 is switched on, so as to write the second clock signal into the second node N2. This method is adopted to control the electric level of the second node N2, so as to control the reset circuit 300. It should be noted that the control circuit 400 is not limited to this case, and the control circuit 400 may also be a circuit formed of other components to realize corresponding functions.

The output stabilizing circuit 600 may be implemented as the tenth transistor T10. A gate electrode of the tenth transistor T10 is configured to be connected with the first voltage terminal VGL to receive the first voltage signal; a first terminal of the tenth transistor T10 is configured to be connected with the input circuit 100 and the reset stabilizing circuit 500 (connected to the third node N3); and a second terminal of the tenth transistor T10 is configured to be connected with the first node N1. The tenth transistor T10 is switched on under the control of the first voltage signal, so as to electrically connect the first node N1 and the third node N3, and then the input signal from the input circuit 100 or the second voltage signal from the reset stabilizing circuit 500 can be written into the first node N1. When the output signal of the output terminal Output is changed from a high electric level to a low electric level, the electric level of the first node N1 can also be reduced and can be lower than the first voltage signal because of the bootstrap effect of the first capacitor C1. Thus, the gate-source voltage Vgs of the tenth transistor T10 may be greater than the threshold voltage Vth (may be a negative value) of the tenth transistor T10, such that the tenth transistor T10 can be switched off, namely the first node N1 and the third node N3 are disconnected. Therefore, the first node N1 is in the floating state, so as to reduce the leakage of the first node N1, ensure that the sixth transistor T6 is switched on, and improve the stability of the output signal of the output terminal Output. It should be noted that the output stabilizing circuit 600 is not limited to this case, and the output stabilizing circuit 600 may also be a circuit formed of other components to realize corresponding functions. It should be noted that in the embodiment of the present disclosure, the output stabilizing circuit 600 (the tenth transistor T10) may also be omitted as appropriate, and in this case, the first node N1 and the third node N3 are electrically connected directly.

It should be noted that when the output stabilizing circuit 600 is implemented as the tenth transistor T10, the gate electrode of the tenth transistor T10 is configured to be connected with the first voltage terminal VGL to receive the first voltage signal. For example, in this case, the tenth transistor T10 is a P-type transistor. Of course, the embodiment of the present disclosure is not limited thereto. For example, in another example, the output stabilizing circuit 600 may also be implemented as an output stabilizing transistor. A gate electrode of the output stabilizing transistor is configured to be connected with the second voltage terminal VGH to receive the second voltage signal; a first terminal of the output stabilizing transistor is configured to be connected with the input circuit 100 and the reset stabilizing circuit 500 (connected to the third node N3); and a second terminal of the output stabilizing transistor is configured to be connected with the first node N1. For example, the connection mode of the output stabilizing transistor is similar to the connection mode of the tenth transistor T10, with the electric level of the voltage terminal connected to the gate electrode of the output stabilizing transistor and the electric level of the voltage terminal connected to the gate electrode of the tenth transistor T10 being different. In the description below, the tenth transistor T10 is equivalent to the output stabilizing transistor, with the electric level of the voltage terminal connected with the gate electrode of a P type transistor being different from the electric level of the voltage terminal connected with the gate electrode of a N type transistor.

Figure 4:
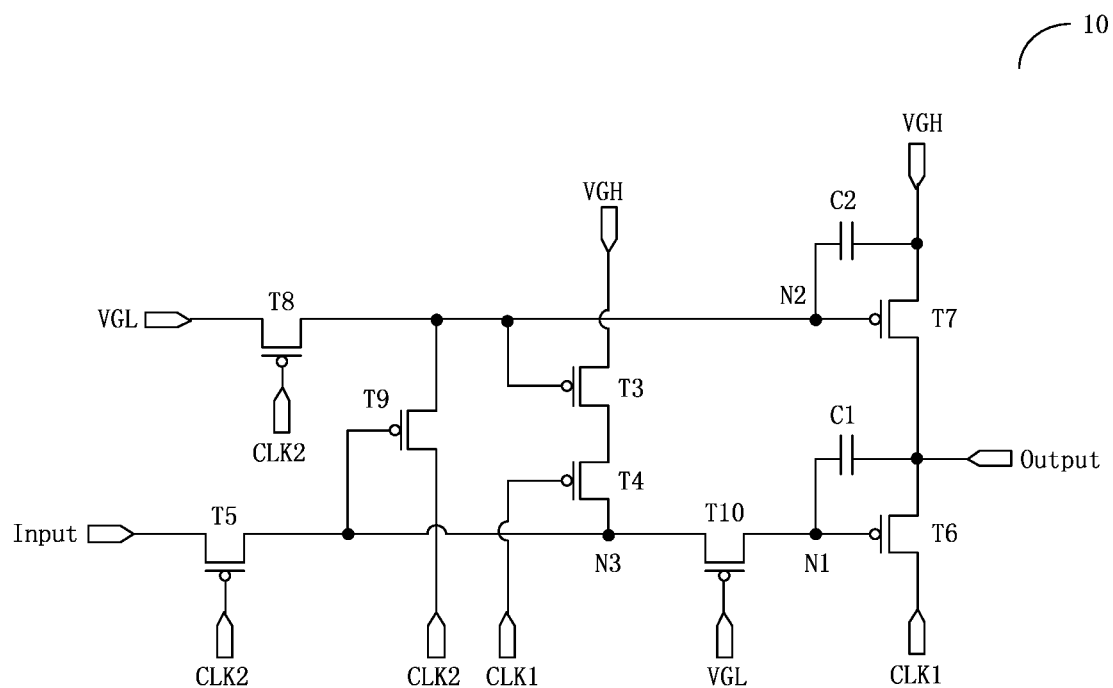
FIG. 4 is a circuit diagram of another specific implementation example of the shift register unit as illustrated in FIG. 2.

FIG. 4 is a circuit diagram of another specific implementation example of the shift register unit as illustrated in FIG. 2. As illustrated in FIG. 4, except that the specific implementation mode of the reset stabilizing circuit 500 is different, the shift register unit 10 in this embodiment is basically the same with the shift register unit 100 as described in FIG. 3. In this embodiment, the reset stabilizing circuit 500 is implemented as a third transistor T3 and a fourth transistor T4. The reset stabilizing circuit includes two signals, namely a first reset stabilizing signal and a second reset stabilizing signal.

A gate electrode of the third transistor T3 is configured to be connected with the second node N2 to take the electric level of the second node N2 as the first reset stabilizing signal; a first terminal of the third transistor T3 is configured to be connected with the second voltage terminal VGH to receive the second voltage signal; and a second terminal of the third transistor T3 is configured to be connected with a first terminal of the fourth transistor T4. A gate electrode of the fourth transistor T4 is configured to be connected with the first clock signal line CLK1 to receive the first clock signal as the second reset stabilizing signal, and a second terminal of the fourth transistor T4 is configured to be connected with the third node N3 (it should be noted that when the tenth transistor T10 is switched on, the second terminal of the fourth transistor T4 is equivalent to be directly connected to the first node N1). When the electric level of the second node N2 is a valid electric level and the electric level of the first clock signal is also a valid electric level, both the third transistor T3 and the fourth transistor T4 are switched on, so as to apply the second voltage signal to the third node N3 and the first node N1 (in this case, the tenth transistor T10 is switched on) to charge the first node N1, thereby ensuring that the output circuit 200 is disconnected and improving the stability of the output signal.

It should be noted that in the description of the embodiments of the present disclosure, the first node N1, the second node N2 and the third node N3 do not represent components that are actually existed, and are intend to represent the conjunction of related electrically connections in the circuit diagram.

It should be noted that all the transistors adopted in the embodiment of the present disclosure may be TFTs, field-effect transistors (FETs) or other switching elements with same characteristics. Description is given in the embodiment of the present disclosure by taking the case where the transistors adopted in the embodiment of the present disclosure are thin film transistors as an example. A source electrode and a drain electrode of the transistor adopted herein may be symmetrical in structure, so the source electrode and the drain electrode of the transistor are indistinguishable in structure. In the embodiment of the present disclosure, in order to distinguish two terminals of the transistor except the gate electrode, one terminal is directly described as the first terminal and the other terminal is directly described as the second terminal.

For example, in one example, the first to tenth transistors T1-T10 are P-type transistors, and the material of the active layers of the P-type transistors may be low-temperature polysilicon (LTPS) or other suitable material. For example, in another example, the first to ninth transistors T1-T9 are P-type transistors, and the tenth transistor T10 is an N-type transistor. In this case, the material of the active layers of the first to ninth transistors T1-T9 may be LTPS or other suitable material, and the material of the active layer of the tenth transistor T10 may be oxide, for example, the material of the active layer of the tenth transistor T10 may be metal oxide or low-temperature polycrystalline oxide (LTPO). The tenth transistor T10 adopts an N-type transistor, has a small leakage current, and can be implemented by low-temperature polycrystalline oxide (LTPO) technology.

For example, the ninth transistor T9 and the tenth transistor T10 may adopt dual-gate TFTs so as to further reduce the leakage current. Of course, and the ninth transistor T9 and the tenth transistor T10 are not limited to this case, in the embodiments of the present disclosure, the transistors may adopt dual-gate TFTs and may also adopt other types of transistors.

In the embodiment of the present disclosure are described by taking the case where all the transistors are P-type transistors as an example. In this case, the first terminal of the transistor is a source electrode; and the second terminal is a drain electrode. It should be noted that the present disclosure includes but not limited thereto. For example, one or more transistors in the shift register unit 10 provided by the embodiment of the present disclosure may also adopt the N-type transistor. In this case, the first terminal of the transistor is a drain electrode; and the second terminal is a source electrode. It's only necessary to correspondingly connect the terminals of the transistors of a selected type with reference to the connections of the terminals of corresponding transistors in the embodiment of the present disclosure, and replace a corresponding high voltage signal with a low voltage signal or replace a corresponding low voltage signal with a high voltage signal. When an N-type transistor is adopted, IGZO may be adopted as the active layer of the TFT. Compared with the case where LTPS or amorphous silicon (such as hydrogenated amorphous silicon) is taken as the active layer of the TFT, the size of the transistor can be effectively reduced and the leakage current can be avoided.

Figure 5:
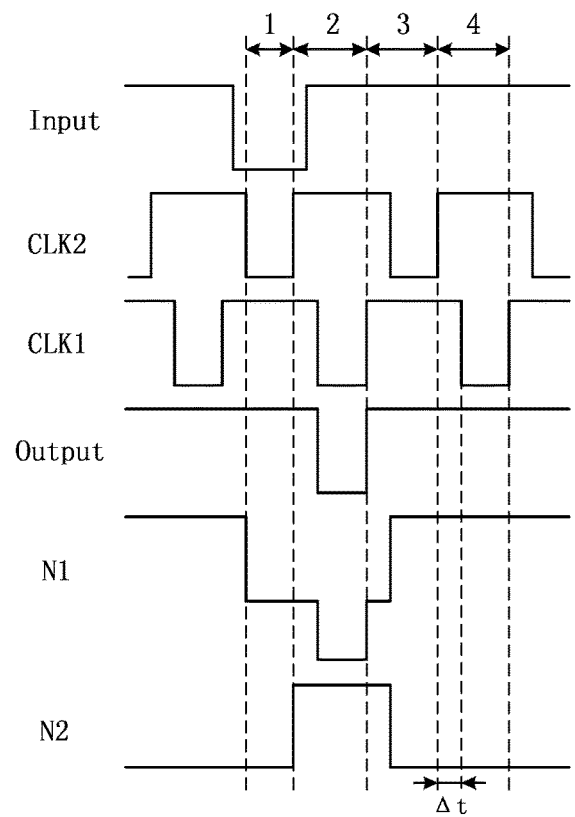
FIG. 5 is a signal timing diagram of the shift register unit provided by some embodiments of the present disclosure.

FIG. 5 is a signal timing diagram of the shift register unit provided by some embodiments of the present disclosure. Description is given below to the working principle of the shift register unit 10 as illustrated in FIG. 3 with reference to the signal timing diagram as illustrated in FIG. 5, and description is given here by taking the case where the transistors are P-type transistors as an example, but the embodiment of the present disclosure is not limited thereto.

As illustrated in FIG. 5, the signal timing includes four periods: an input period 1, an output period 2, a reset period 3 and a reset hold period 4. FIG. 5 illustrates the timing waveforms of the signals in each period.

Figure 6A:
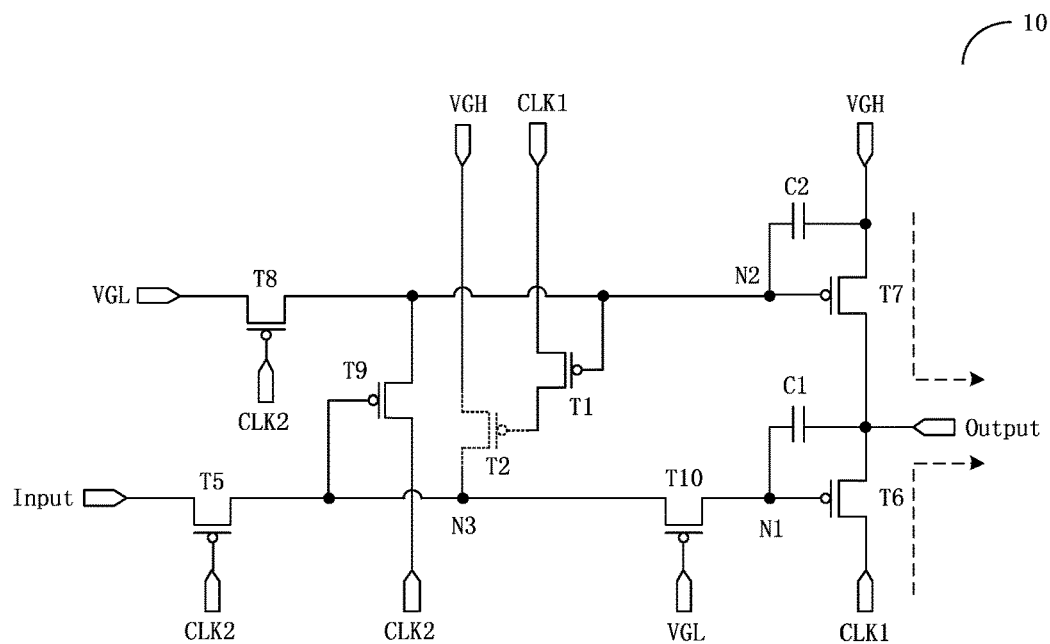
FIGS. 6A to 6D are respectively circuit diagrams, corresponding to four periods as illustrated in FIG. 5, of the shift register unit as illustrated in FIG. 3.
Figure 6B:
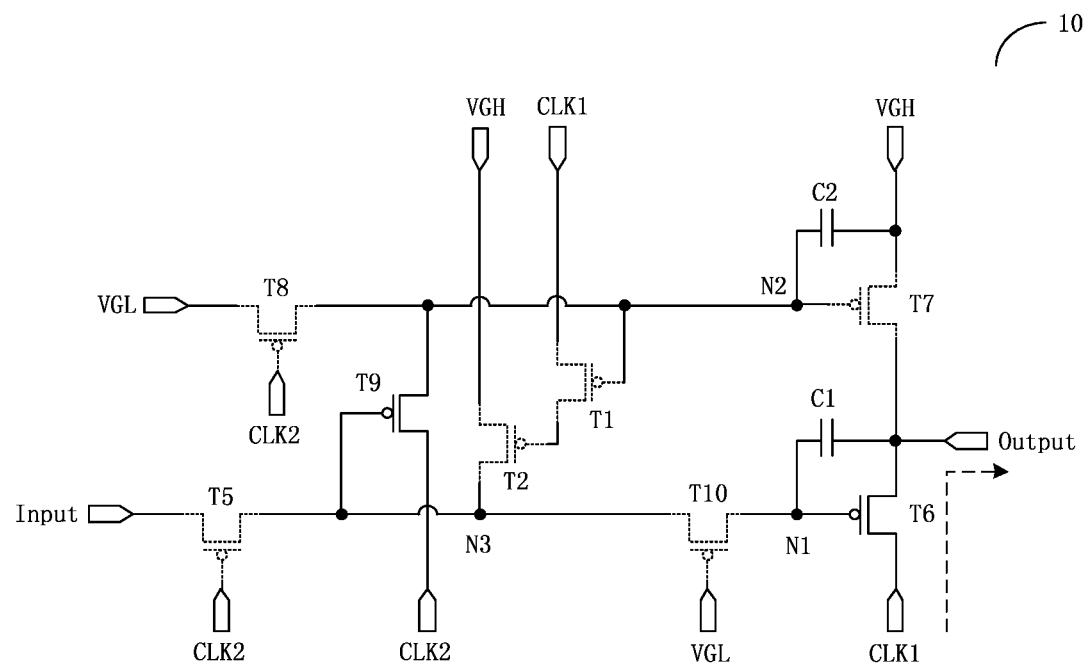
Figure 6C:
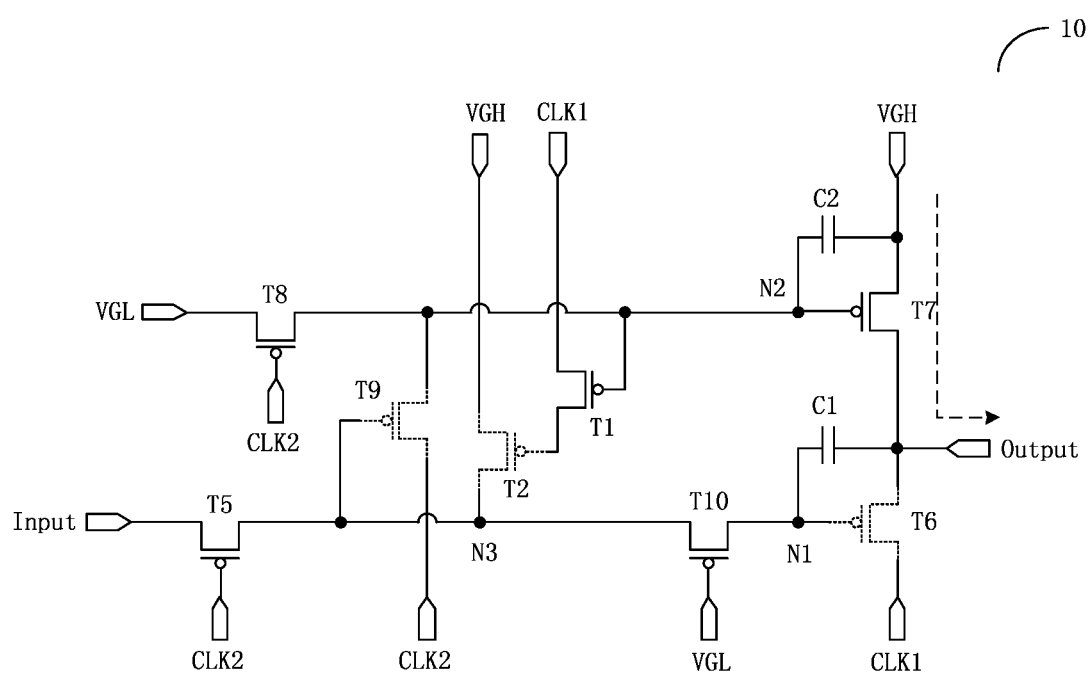
Figure 6D:
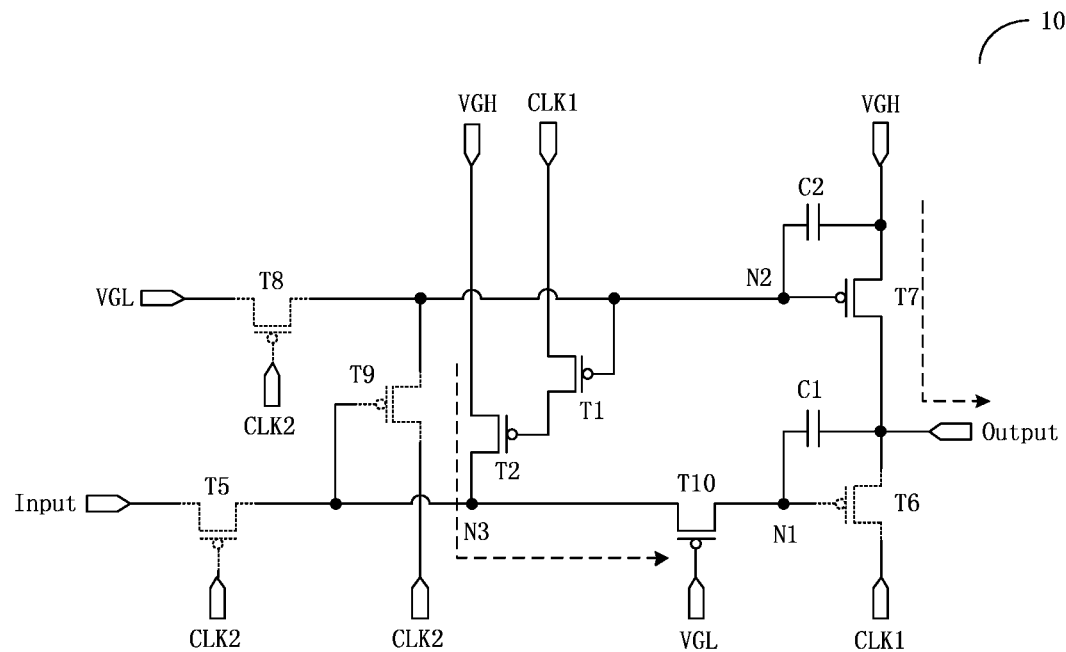

It should be noted that FIGS. 6A to 6D are respectively schematic diagrams when the shift register unit 10 as illustrated in FIG. 3 is in the above-mentioned four periods. FIG. 6A is a schematic diagram when the shift register unit 10 as illustrated in FIG. 3 is in the input period 1. FIG. 6B is a schematic diagram when the shift register unit 10 as illustrated in FIG. 3 is in the output period 2. FIG. 6C is a schematic diagram when the shift register unit 10 as illustrated in FIG. 3 is in the reset period 3. FIG. 6D is a schematic diagram when the shift register unit 10 as illustrated in FIG. 3 is in the reset hold period 4.

In addition, all the transistors marked by dotted lines in FIGS. 6A-6D indicate that the transistors marked by dotted lines are in off state in corresponding period(s), and dotted lines with arrows in FIGS. 6A-6D represent the direction of the current in the shift register unit in corresponding period (s). Description is given by taking the case where the transistors as illustrated in FIGS. 6A to 6D are P-type transistors as an example, that is, the transistors are switched on when the gate electrodes of the transistors are applied with a turned-on electric level (a valid electric level, which is a low electric level here) and the transistors are switched off when the gate electrodes of the transistors are applied with a turned-off electric level (an invalid electric level, which is a high electric level here). The following embodiments are the same in this respect, so no further description will be given here.

In the input period 1, the reset period 3 and the reset hold period 4, the output terminal Output outputs high electric levels; and in the output period 2, the output terminal Output outputs a high electric level at first and then outputs a low electric level. Thus, the shift register unit provided by the embodiment of the present disclosure can realize shift register function.

In the input period 1, as illustrated in FIGS. 5 and 6A, the second clock signal is at a low electric level, so the fifth transistor T5 is switched on. The tenth transistor T10 is switched on by the low electric level of the first voltage signal. The input signal from the input terminal Input is written into the first node N1, and in this case, the first node N1 is at a low electric level. The sixth transistor T6 is switched on by the low electric level of the first node N1, and the first clock signal is outputted to the output terminal Output. The eighth transistor T8 is switched on by the low electric level of the second clock signal, so as to write the first voltage signal into the second node N2. The ninth transistor T9 is switched on by the low electric level of the third node N3, so as to write the second clock signal into the second node N2. In this case, both the second clock signal and the first voltage signal are at a low electric level, so the second node N2 is at a low electric level. The seventh transistor T7 is switched on by the low electric level of the second node N2, so as to output the second voltage signal to the output terminal Output. The first transistor T1 is switched on by the low electric level of the second node N2, so as to write the first clock signal into the gate electrode of the second transistor T2. The second transistor T2 is switched off by the high electric level of the first clock signal.

As illustrated in FIG. 6A, in the input period 1, an output path (as illustrated by the dotted lines with arrows in FIG. 6A) is formed, and the output terminal Output outputs a high electric level (in this case, both the first clock signal and the second clock signal are in a high electric level).

At the initial period of the output period 2, as illustrated in FIGS. 5 and 6B, the second clock signal is changed in advance (changed into a high electric level in advance) as compared with the first clock signal, and both the fifth transistor T5 and the eighth transistor T8 are switched off by the high electric level of the second clock signal. The third node N3 maintains the potential (low electric level) in the previous period, and the ninth transistor T9 maintains the on state. The second clock signal pulls up the electric level of the second node N2, so as to switch off the seventh transistor T7. The first transistor T1 and the second transistor T2 are also switched off under the action of high electric level of the second node N2. The first node N1 maintains the potential (low electric level) in the previous period; the sixth transistor T6 maintains the on state; the first clock signal is outputted to the output terminal Output; and the output terminal Output outputs a high electric level (in this case, the first clock signal is at a high electric level).

For example, as for each pulse period of the first clock signal and the second clock signal (including one high electric level signal and one low electric level signal), the duration of the high electric level signal is unequal to the duration of the low electric level signal, so the second clock signal can be changed in advance as compared with the first clock signal or the first clock signal can be changed in advance as compared with the second clock signal. For example, as for the first clock signal and the second clock signal, the duration of the high electric level signal is greater than the duration of the low electric level signal.

When the first clock signal is changed into a low electric level, that is, at other periods of the output period 2 (namely at the period after the initial period of the output period 2 and before the reset period 3), the output terminal Output outputs a low electric level signal. Two electrodes of the first capacitor C1 are respectively connected with the first node N1 and the output terminal Output. In this case, the first node N1 is in the floating state because the fifth transistor T5 and the second transistor T2 are switched off. Because of the bootstrap effect of the first capacitor C1, the electric level of the first node N1 can be further reduced along with the reduction of the electric level of the output signal of the output terminal Output. After the electric level of the first node N1 is further reduced, the electric level may be lower than the first voltage signal, so as to switch off the tenth transistor T10. This arrangement can disconnect the first node N1 and the third node N3 in the output period 2 to reduce the leakage of the first node N1 and then improve the stability of the output signal of the output terminal Output. That is to say, the shift register unit provided by some embodiments of the present disclosure can improve the stability of the signal (for example, improving the stability of the low electric level signal) outputted in the valid electric level output period (for example, the period for outputting the low electric level in the output period 2). For example, the fifth transistor T5 and the tenth transistor T10 may also adopt a dual-gate structure to reduce the leakage of the first node N1, so as to further improve the stability of the signal outputted in the valid electric level output period.

For example, the second clock signal is changed in advance (changed into a high electric level in advance) as compared with the first clock signal, and the advance time Δt is about 5% to 25% of the valid time of the high electric level of the first clock signal or the second clock signal, and for another example, 10% to 20% of the valid time of the high electric level of the first clock signal or the second clock signal. Of course, the advance time Δt is not limited these cases, and the advance time Δt may also be determined according to actual demands, and no limitation will be given here in the embodiment of the present disclosure.

As illustrated in FIG. 6B, an output path (as illustrated by dotted lines with arrows in FIG. 6B) is formed in the output period 2; at the initial period of the output period 2, the output terminal Output outputs a high electric level (in this case, the first clock signal is at a high electric level); and at other periods of the output period 2 except the initial period (namely the period after the initial period of the output period 2 and before the reset period 3), the output terminal Output outputs a low electric level (in this case, the first clock signal is at a low electric level).

In the reset period 3, as illustrated in FIGS. 5 and 6C, the first clock signal is changed in advance (changed into a high electric level in advance) as compared with the second clock signal, and the output signal of the output terminal Output is changed into a high electric level. Similarly, because of the bootstrap effect of the first capacitor C1, the electric level of the first node N1 is also correspondingly changed, so as to switch on the tenth transistor T10 and electrically connect the first node N1 and the third node N3. For example, the first clock signal is changed in advance (changed into a high electric level in advance) as compared with the second clock signal, and the advance time Δt is the same with the advance time as described above.

When the second clock signal is changed into a low electric level, the eighth transistor T8 is switched on; the first voltage signal pulls down the electric level of the second node N2; the seventh transistor T7 is switched on by the low electric level of the second node N2; the second voltage signal is outputted to the output terminal Output; and the output signal of the Output terminal Output still maintains a high electric level. The fifth transistor T5 is switched on by the low electric level of the second clock signal, and the input signal pulls up the electric level at the third node N3 and the first node N1, so as to switch off the sixth transistor T6. In this case, the first transistor T1 is switched on by the low electric level at the second node N2; the second transistor T2 is switched off by the high electric level of the first clock signal; and the ninth transistor T9 is switched off by the high electric level at the third node N3.

As illustrated in FIG. 6C, in the reset period 3, a reset path (as illustrated by dotted lines with arrows in FIG. 6C) is formed, and the output terminal Output outputs a high electric level.

In the reset hold period 4, as illustrated in FIGS. 5 and 6D, the second clock signal is at a high electric level, so as to switch off the fifth transistor T5 and the eighth transistor T8. The second node N2 maintains the potential (low electric level) of the previous period, so the seventh transistor T7 maintains the on state, and the output signal of the output terminal Output is still in a high electric level. The third node N3 maintains the potential (high electric level) of the previous period, and the ninth transistor T9 is switched off by the high electric level at the third node N3. The first transistor T1 is switched on by the low electric level at the second node N2.

When the first clock signal is changed into a low electric level, the second transistor T2 is switched on, so as to apply the second voltage signal to the third node N3 and the first node N1 to charge the first node N1. The sixth transistor T6 is switched off by the high electric level of the first node N1. In the subsequent periods, whenever the first clock signal is at a low electric level, the second transistor T2 is switched on, and the first node N1 is charged. By adoption of this arrangements, the first node N1 can be intermittently charged to ensure that the sixth transistor T6 is switched off and then improve the stability of the output signal of the output terminal Output. For example, the shift register unit provided by some embodiments of the present disclosure can improve the stability of the signal outputted in the reset hold period (for example, improving the stability of the high electric level signal), and then can prolong the time of stable output of, for example, the high electric level signal.

As illustrated in FIG. 6D, in the reset hold period 4, a reset path and a path for charging the first node N1 (as illustrated by dotted line with arrow in FIG. 6D) are formed; the output terminal Output keeps outputting a high electric level; and the first node N1 is charged to ensure that the sixth transistor T6 is switched off.

Figure 7:
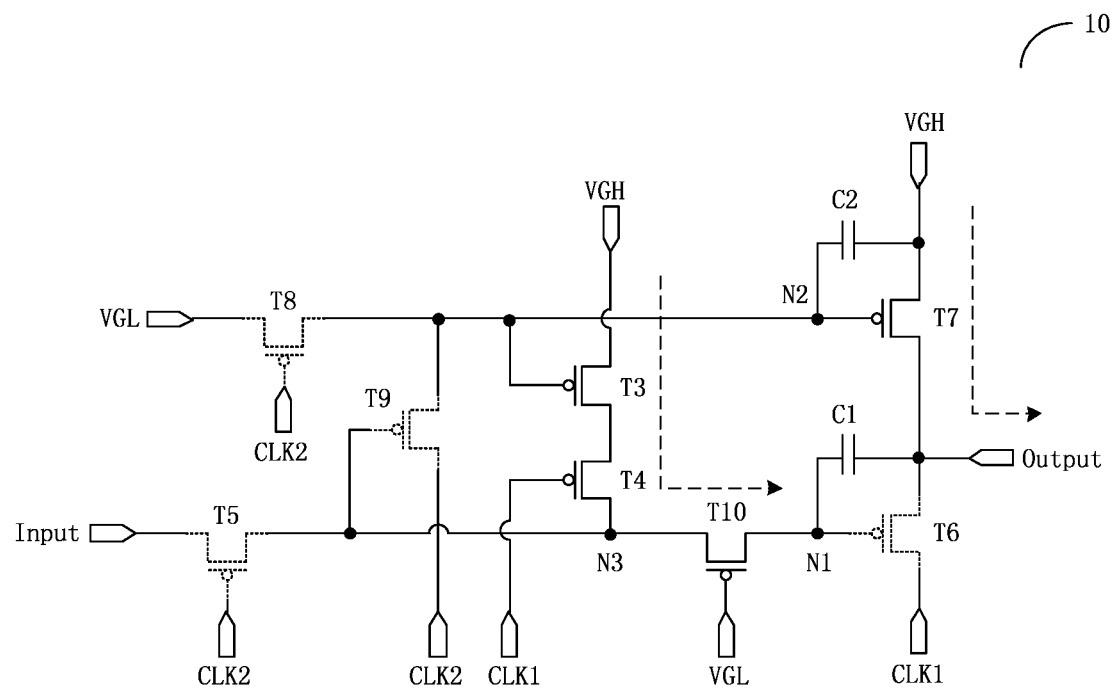
FIG. 7 is a circuit diagram, corresponding to the reset hold period as illustrated in FIG. 5, of the shift register unit as illustrated in FIG. 4.

FIG. 7 is a circuit diagram, corresponding to the reset hold period in FIG. 5, of the shift register unit as illustrated in FIG. 4. Description will be given below to the working principle of the shift register unit 10 as illustrated in FIG. 4 with reference to the signal timing diagram as illustrated in FIG. 5, and description is given here by taking the case where the transistors are P-type transistors as an example, but the embodiment of the present disclosure is not limited thereto.

In addition, all the transistors marked by dotted lines in FIG. 7 indicate that the transistors marked by dotted lines are in the off state in corresponding period(s), and the dotted lines with arrows in FIG. 7 represent the direction of the current in the shift register unit in corresponding period(s). Description is given by taking the case where the transistors as illustrated in FIG. 7 are all P-type transistors as an example, that is, the transistors are switched on when the gate electrodes of the transistors are applied with a turned-on electric level (a valid electric level, which is low electric level here) and the transistors are switched off when the gate electrodes of the transistors are applied with a turned-off electric level (an invalid electric level, which is high electric level here). The following embodiments are the same in this respect, so no further description will be given here.

As illustrated in FIG. 5, the signal timing includes four periods: an input period 1, an output period 2, a reset period 3 and a reset hold period 4. FIG. 5 illustrates the timing waveforms of the signals in each period.

In the input period 1, the output period 2 and the reset period 3, because the electric level of the first clock signal and the second node N2 is not a low electric level at the same time, the third transistor T3 and the fourth transistor T4 cannot be simultaneously switched on, so the second voltage signal of the second voltage terminal VGH cannot be applied to the third node N3. In the input period 1, the output period 2 and the reset period 3, the working principle of the shift register unit 10 is similar to the working principle of the shift register unit 10 as illustrated in FIG. 3, so no further description will be given here.

In the reset hold period 4, as illustrated in FIGS. 5 and 7, the second clock signal is in a high electric level, so as to switch off the fifth transistor T5 and the eighth transistor T8. The second node N2 maintains the potential (low electric level) of the previous period, so the seventh transistor T7 maintains the on state, and the output signal of the output terminal Output is still at a high electric level. The third node N3 maintains the potential (high electric level) of the previous period, and the ninth transistor T9 is switched off by the high electric level at the third node N3. The third transistor T3 is switched on by the low electric level at the second node N2.

When the first clock signal is changed into a low electric level, the fourth transistor T4 is switched on, so as to apply the second voltage signal to the third node N3 and the first node N1 to charge the first node N1. The sixth transistor T6 is switched off by the high electric level of the first node N1. In the subsequent periods, whenever the first clock signal is at a low electric level, the fourth transistor T4 is switched on, and the first node N1 is charged. By adoption of this arrangements, the first node N1 can be intermittently charged to ensure that the sixth transistor T6 is switched off and then improve the stability of the output signal of the output terminal Output.

As illustrated in FIG. 7, in the reset hold period 4, a reset path and a path for charging the first node N1 (as illustrated by dotted lines with arrows in FIG. 7) are formed; the output terminal Output keeps outputting high electric level; and the first node N1 is charged to ensure that the sixth transistor T6 is switched off.

At least one embodiment of the present disclosure further provides a shift register unit, which comprises eleventh to eighteenth transistors, a third capacitor and a fourth capacitor. The shift register unit can improve the stability of the output signal, prevent the output signal from being interfered by other signals, and improve the display quality.

Figure 8:
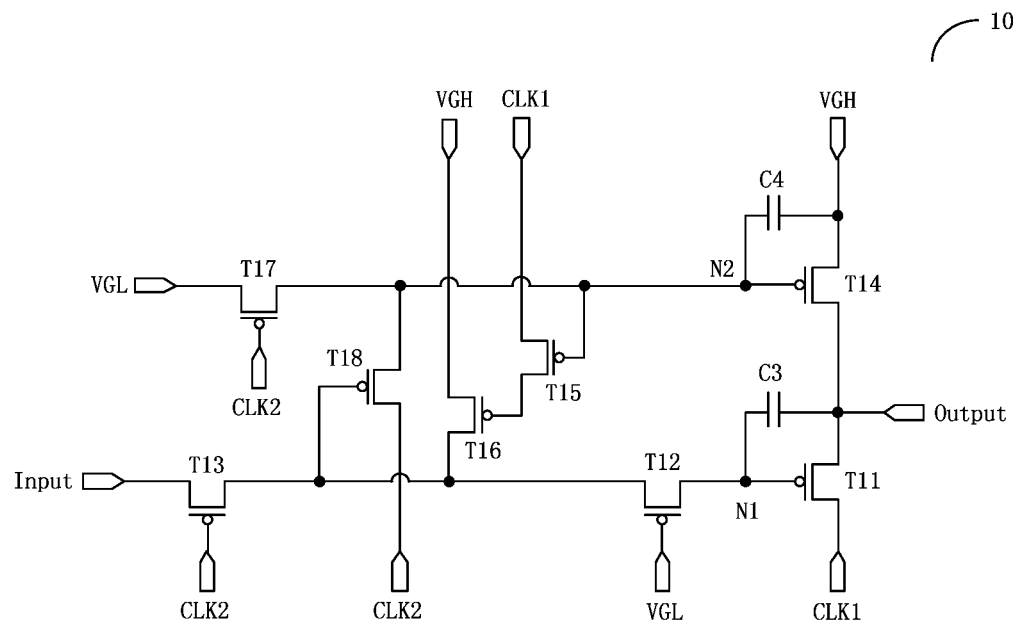
FIG. 8 is a circuit diagram of a shift register unit provided by some embodiments of the present disclosure.

FIG. 8 is a circuit diagram of the shift register unit provided by some embodiments of the present disclosure. As illustrated in FIG. 8, the shift register unit 10 includes eleventh to eighteenth transistors T11-T18, a third capacitor C3 and a fourth capacitor C4.

A gate electrode of the eleventh transistor T11 is configured to be connected with a first node N1; a first terminal of the eleventh transistor T11 is configured to be connected with a first clock signal line CLK1 to receive a first clock signal; and a second terminal of the eleventh transistor T11 is configured to be connected with an output terminal Output. A first electrode of the third capacitor C3 is configured to be connected with the gate electrode (the first node N1) of the eleventh transistor T11, and a second electrode of the third capacitor C3 is configured to be connected with the second terminal (the output terminal Output) of the eleventh transistor T11.

A gate electrode of the twelfth transistor T12 is configured to be connected with a first voltage terminal VGL to receive a first voltage signal; the twelfth transistor T12 further includes a first terminal and a second terminal; and the second terminal of the twelfth transistor T12 is configured to be connected with the first node N1. A gate electrode of the thirteenth transistor T13 is configured to be connected with a second clock signal line CLK2 to receive a second clock signal; a first terminal of the thirteenth transistor T13 is configured to be connected with an input terminal Input to receive an input signal; and a second terminal of the thirteenth transistor T13 is configured to be connected with the first terminal of the twelfth transistor T12.

A gate electrode of the fourteenth transistor T14 is configured to be connected with the second node N2; a first terminal of the fourteenth transistor T14 is configured to be connected with the second voltage terminal VGH to receive a second voltage signal; and a second terminal of the fourteenth transistor T14 is configured to be connected with the second terminal (the output terminal Output) of eleventh transistor T11. A first electrode of the fourth capacitor C4 is configured to be connected with the gate electrode (the second node N2) of the fourteenth transistor T14, and a second electrode of the fourth capacitor C4 is configured to be connected with the first terminal (the second voltage terminal VGH) of the fourteenth transistor T14.

A gate electrode of the fifteenth transistor T15 is configured to be connected with the second node N2, and a first terminal of the fifteenth transistor T15 is configured to be connected with the first clock signal line CLK1 to receive the first clock signal. A gate electrode of the sixteenth transistor T16 is configured to be connected with the second terminal of the fifteenth transistor T15; a first terminal of the sixteenth transistor T16 is configured to be connected with the second voltage terminal VGH to receive the second voltage signal; and a second terminal of the sixteenth transistor T16 is configured to be connected with the first terminal of the twelfth transistor T12.

A gate electrode of the seventeenth transistor T17 is configured to be connected with the second clock signal line CLK2 to receive the second clock signal; a first terminal of the seventeenth transistor T17 is configured to be connected with the first voltage terminal VGL to receive the first voltage signal; and a second terminal of the seventeenth transistor T17 is configured to be connected with the second node N2. A gate electrode of the eighteenth transistor T18 is configured to be connected with the second terminal of the thirteenth transistor T13; a first terminal of the eighteenth transistor T18 is configured to be connected with the second clock signal line CLK2 to receive the second clock signal; and a second terminal of the eighteenth transistor T18 is configured to be connected with the second node N2.

The working principle of the shift register unit 10 is similar to the working principle of the shift register unit as described in FIG. 5 and FIGS. 6A-6D, so no further description will be given here.

At least one embodiment of the present disclosure further provides a shift register unit, which comprises nineteenth to twenty-sixth transistors, a fifth capacitor and a sixth capacitor. The shift register unit can improve the stability of the output signal, prevent the output signal from being interfered by other signals, and improve the display quality.

Figure 9:
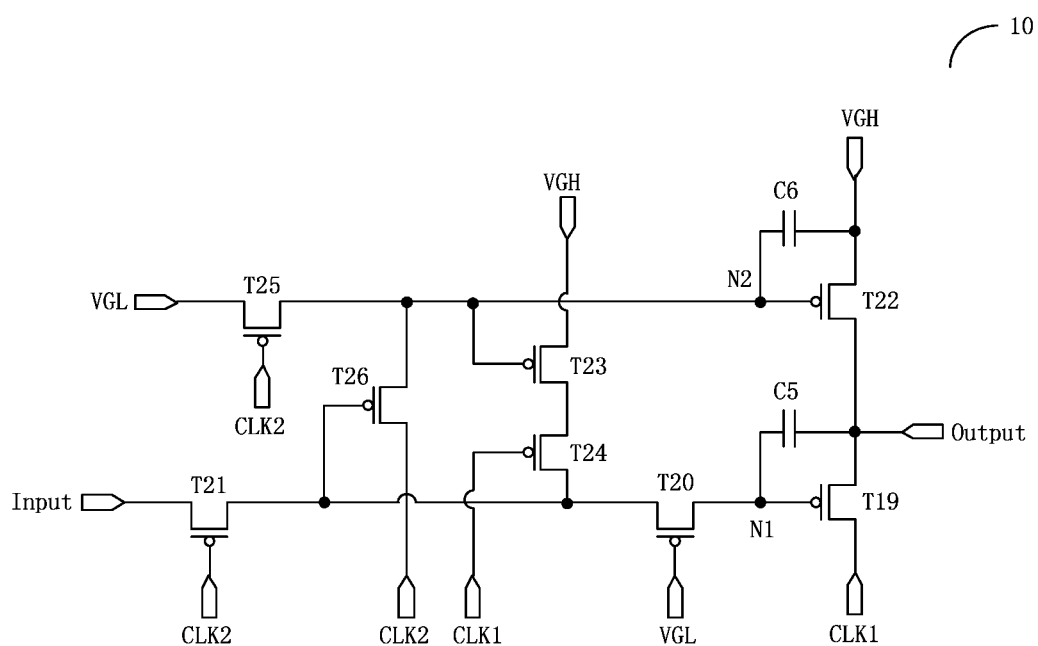
FIG. 9 is a circuit diagram of another shift register unit provided by some embodiments of the present disclosure.

FIG. 9 is a circuit diagram of another shift register unit provided by some embodiments of the present disclosure. As illustrated in FIG. 9, the shift register unit 10 comprises nineteenth to twenty-sixth transistors T19-T26, a fifth capacitor C5 and a sixth capacitor C6.

A gate electrode of the nineteenth transistor T19 is configured to be connected with a first node N1; a first terminal of the nineteenth transistor T19 is configured to be connected with a first clock signal line CLK1 to receive a first clock signal; and a second terminal of the nineteenth transistor T19 is configured to be connected with an output terminal Output. A first electrode of the fifth capacitor C5 is configured to be connected with the gate electrode (the first node N1) of the nineteenth transistor T19, and a second electrode of the fifth capacitor C5 is configured to be connected with the second terminal (the output terminal Output) of the nineteenth transistor T19.

A gate electrode of the twentieth transistor T20 is configured to be connected with a first voltage terminal VGL to receive a first voltage signal; the twentieth transistor T20 further includes a first terminal and a second terminal; and the second terminal of the twentieth transistor T20 is configured to be connected with the first node N1. A gate electrode of the twenty-first transistor T21 is configured to be connected with a second clock signal line CLK2 to receive a second clock signal; a first terminal of the twenty-first transistor T21 is configured to be connected with an input terminal Input to receive an input signal; and a second terminal of the twenty-first transistor T21 is configured to be connected with the first terminal of the twentieth transistor T20.

A gate electrode of the twenty-second transistor T22 is configured to be connected with a second node N2; a first terminal of the twenty-second transistor T22 is configured to be connected with a second voltage terminal VGH to receive a second voltage signal; and a second terminal of the twenty-second transistor T22 is configured to be connected with the second terminal (the output terminal Output) of the nineteenth transistor T19. A first electrode of the sixth capacitor C6 is configured to be connected with the gate electrode (the second node N2) of the twenty-second transistor T22, and a second electrode of the sixth capacitor C6 is configured to be connected with the first terminal (the second voltage terminal VGH) of the twenty-second transistor T22.

A gate electrode of the twenty-third transistor T23 is configured to be connected with the second node N2, and a first terminal of the twenty-third transistor 123 is configured to be connected with the second voltage terminal VGH to receive the second voltage signal. A gate electrode of the twenty-fourth transistor T24 is configured to be connected with the first clock signal line CLK1 to receive the first clock signal; a first terminal of the twenty-fourth transistor T24 is configured to be connected with the second terminal of the twenty-third transistor T23; and a second terminal of the twenty-fourth transistor T24 is configured to be connected with the first terminal of the twentieth transistor T20.

A gate electrode of the twenty-fifth transistor T25 is configured to be connected with the second clock signal line CLK2 to receive the second clock signal; a first terminal of the twenty-fifth transistor T25 is configured to be connected with the first voltage terminal VGL to receive the first voltage signal; and a second terminal of the twenty-fifth transistor T25 is configured to be connected with the second node N2. A gate electrode of the twenty-sixth transistor T26 is configured to be connected with the second terminal of the twenty-first transistor T21; a first terminal of the twenty-sixth transistor T26 is configured to be connected with the second clock signal line CLK2 to receive the second clock signal; and a second terminal of the twenty-sixth transistor T26 is configured to be connected with the second node N2.

The working principle of the shift register unit 10 is similar to the working principle of the shift register unit as described in FIG. 8. No further description will be given here.

At least one embodiment of the present disclosure further provides a gate drive circuit, which comprises a plurality of cascaded shift register units. The plurality of cascaded shift register units include P first shift register units. The first shift register units each adopt the shift register unit provided by any embodiment of the present disclosure, and P is an integer greater than one. The gate drive circuit can improve the stability of the output signal, prevent the output signal from being interfered by other signals, and improve the display quality.

Figure 10:
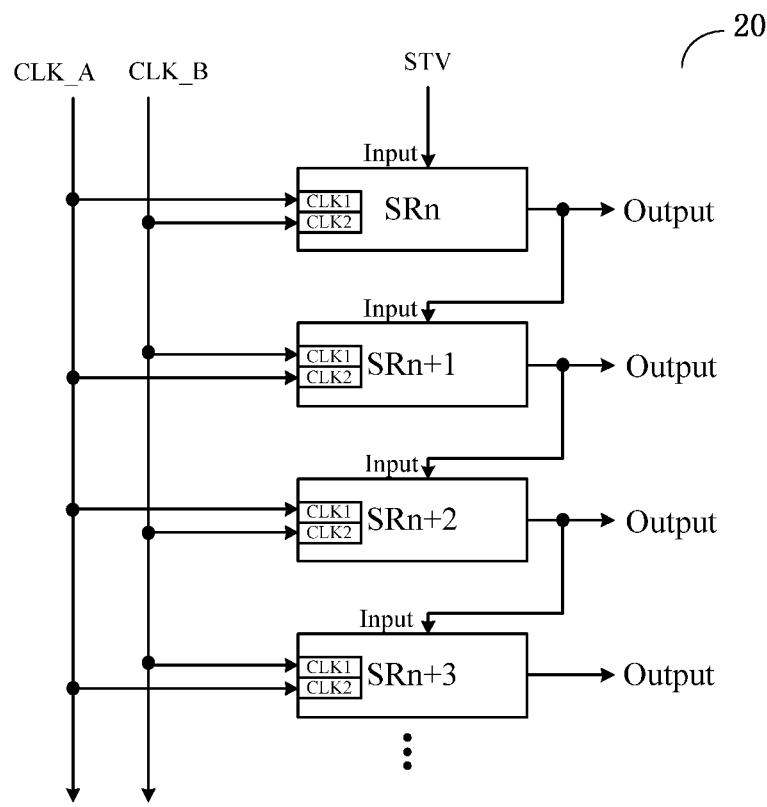
FIG. 10 is a schematic block diagram of a gate drive circuit provided by some embodiments of the present disclosure.

FIG. 10 is a schematic block diagram of a gate drive circuit provided by some embodiments of the present disclosure. As illustrated in FIG. 10, the gate drive circuit 20 comprises a plurality of cascaded shift register units (SRn, SRn+1, SRn+2, SRn+3, etc.). The number of the plurality of shift register units is not limited and can be determined according to actual demands. For example, the plurality of shift register units include P first shift register units, and P is an integer greater than one. For example, as for a display device with the resolution of 640×480, P may be equal to 480, and correspondingly, as for a display device with the resolution of 1920×1440, P may be equal to 1440. For example, the first shift register units each adopt the shift register unit 10 provided by any embodiment of the present disclosure. That is to say, in the gate drive circuit 20, partial or all of the shift register units may adopt the shift register unit 10 provided by any embodiment of the present disclosure. The gate drive circuit 20 may be directly integrated on the array substrate of a display device to realize a driving function of progressive scanning by adoption of the same manufacturing process as the TFTs.

For example, the plurality of shift register units are respectively provided with an input terminal Input and an output terminal Output. For example, except the last stage, the output terminal Output of the shift register unit of each-stage is connected with the input terminal Input of the shift register unit of the next-stage. For example, the input terminal Input of the shift register unit of the first-stage is configured to receive a trigger signal STV.

For example, the gate drive circuit 20 further comprises a first system clock CLK_A and a second system clock CLK_B so as to be connected with the first clock signal line CLK1 and the second clock signal line CLK2 of each shift register unit. For example, when the first clock signal line CLK1 of the shift register unit of a certain-stage (e.g., SRn) is connected with the first system clock CLK_A and the second clock signal line CLK2 of the shift register unit of a certain-stage (e.g., SRn) is connected with the second system clock CLK_B, the second clock signal line CLK2 of the shift register unit of the next-stage (e.g., SRn+1) is connected with the first system clock CLK_A and the first clock signal line CLK1 of the shift register unit of the next-stage (e.g., SRn+1) is connected with the second system clock CLK_B. The connection mode of the subsequent shift register units and the first system clock CLK_A and the second system clock CLK_B is similar to this, so as to ensure that the output signals of the output terminals Output of the shift register units are shifted and connected to each other in timing. For example, the gate drive circuit 20 further comprises a timing controller. The timing controller is, for example, configured to provide the first system clock signal and the second system clock signal to the shift register units, and may also be configured to provide the trigger signal STV.

For example, when the gate drive circuit 20 is adopted to drive a display panel, the gate drive circuit 20 may be disposed on one side of the display panel. For example, the display panel includes a plurality of rows of gate lines, and the output terminals Output of the shift register units in the gate drive circuit 20 may be configured to be sequentially connected with the plurality of rows of gate lines to output gate scanning signals. Of course, the gate drive circuits 20 may also be respectively disposed on two sides of the display panel to realize dual-side driving. No limitation will be given to the arrangement mode of the gate drive circuit 20 in the embodiment of the present disclosure. For example, one gate drive circuit 20 may be disposed on one side of the display panel to drive odd rows of gate lines and the other gate drive circuit 20 may be disposed on the other side of the display panel to drive even rows of gate lines.

At least one embodiment of the present disclosure further provides a display device, which comprises the gate drive circuit provided by any embodiment of the present disclosure. The output signal of the gate drive circuit in the display device has good stability; the output signal may not be easily interfered by other signals; and good display quality can be achieved.

Figure 11:
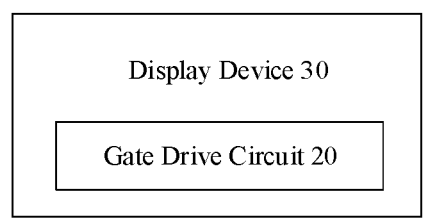
FIG. 11 is a schematic block diagram of a display device provided by some embodiments of the present disclosure.

FIG. 11 is a schematic block diagram of a display device provided by some embodiments of the present disclosure. As illustrated in FIG. 11, the display device 30 comprises a gate drive circuit 20 which is the gate drive circuit provided by any embodiment of the present disclosure. For example, the display device 30 may be any product or any component having display function such as a liquid crystal panel, a liquid crystal TV, a display, an organic light-emitting diode (OLED) panel, an OLED TV, an e-paper display device, a mobile phone, a tablet PC, a notebook computer, a digital album or a navigator. No limitation will be given here in the embodiment of the present disclosure. The technical effects of the display device 30 may refer to corresponding description on the shift register unit 10 and the gate drive circuit 20 provided by the above-mentioned embodiment, so no further description will be given here.

Figure 12:
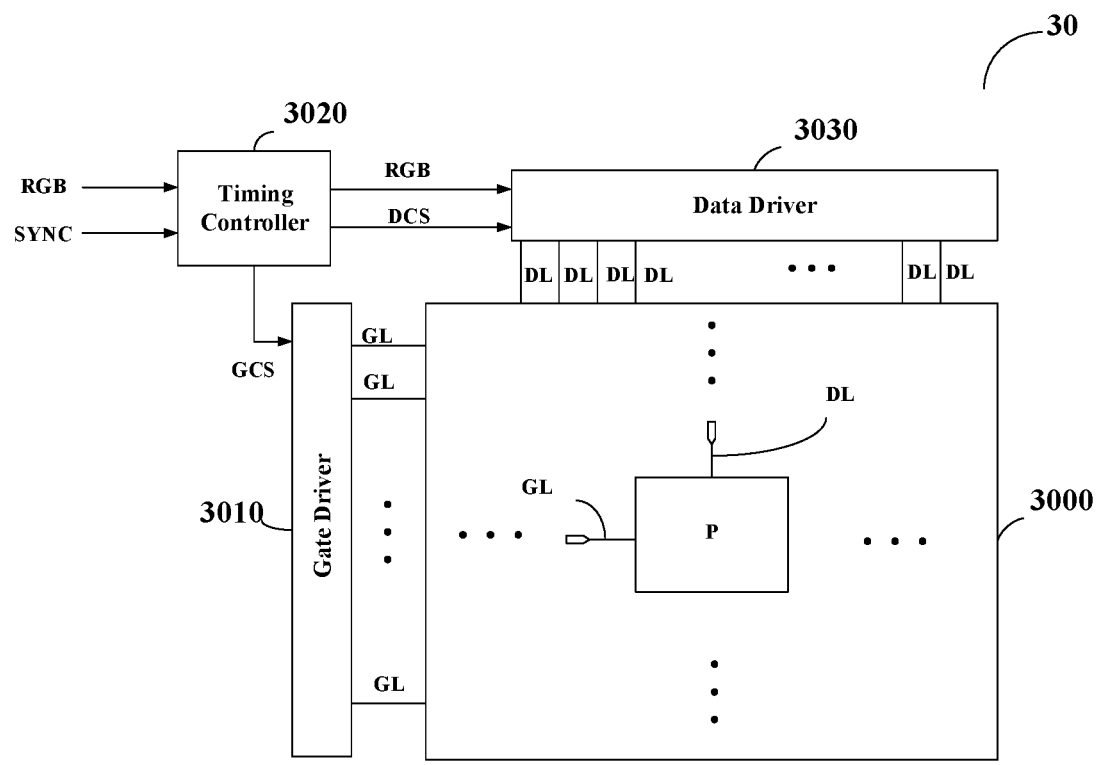
FIG. 12 is a schematic block diagram of another display device provided by some embodiments of the present disclosure.

FIG. 12 is a schematic block diagram of another display device provided by some embodiments of the present disclosure. As illustrated in FIG. 12, the display device 30 comprises a display panel 3000, a gate driver 3010, a timing controller 3020 and a data driver 3030. The display panel 3000 includes a plurality of pixel units P defined by the intersection of a plurality of scanning lines GL and a plurality of data lines DL. The gate driver 3010 is configured to drive the plurality of scanning lines GL. The data driver 3030 is configured to drive the plurality of data lines DL. The timing controller 3020 is configured to process image data RGB inputted from the outside of the display device 30, provide processed image data RGB to the data driver 3030, output a gate control signal GCS to the gate driver 3010 and output a data control signal DCS to the data driver 3030, so as to control the gate driver 3010 and the data driver 3030.

For example, the gate driver 3010 includes the gate drive circuit 20 provided by any foregoing embodiment. The output terminals Output of the plurality of shift register units in the gate drive circuit 20 are correspondingly connected with the plurality of scanning lines GL; the output terminal Output of the shift register unit at the N(th) stage is also connected with the input circuit of the shift register unit at the N+1(th) stage to provide an input signal; and N is an integer greater than zero. The plurality of scanning lines GL are correspondingly connected with the pixel units P arranged in a plurality of rows. The output terminals Output of the shift register units in the gate drive circuit 20 sequentially output signals to the plurality of scanning lines GL, so that progressive scanning can be realized with respect to the plurality of rows of pixel units P in the display panel 3000.

For example, the data driver 3030 adopts gamma reference voltage to convert digital image data RGB inputted from the timing controller 3020 into data signals according to the plurality of data control signals DCS from the timing controller 3020. The data driver 3030 provides the converted data signals to the plurality of data lines DL.

For example, the timing controller 3020 is configured to process the image data RGB inputted from the outside, so as allow the processed image data to be matched with the size and the resolution of the display panel 3000, and then provide the processed image data to the data driver 3030. The timing controller 3020 adopts synchronizing signals (e.g., dot-clock DCLK, a data enable signal DE, a horizontal synchronizing signal and a vertical synchronizing signal) inputted from the outside of the display device 30 to generate the plurality of gate control signals GCS and the plurality of data control signals DCS. The timing controller 3020 respectively provides the generated gate control signals GCS and the generated data control signals DCS to the gate driver 3010 and the data driver 3030 which are respectively configured for controlling the gate driver 3010 and the data driver 3030.

For example, the gate driver 3010 and the data driver 3030 can be implemented as semiconductor chips. The display device 30 may further comprise other components such as a signal decoding circuit and a voltage conversion circuit. The components, for example, may adopt the existing conventional components, so no further description will be given here.

At least one embodiment of the present disclosure further provides a method for driving a shift register unit, which may be used for driving the shift register unit 10 provided by any embodiment of the present disclosure. The driving method can improve the stability of the output signal of the shift register unit 10, avoid the interference of other signals, and then improve the display quality of the display device employing the shift register unit 10.

For example, the driving method comprises the following operations:

in an input period, writing an input signal into a first node N1 to switch on an output circuit 200;

in an output period, allowing the output circuit 200 to output a clock signal to an output terminal Output;

in a reset period, switching on a reset circuit 300 under the control of the electric level of a second node N2 to reset the output terminal Output; and in a reset hold period, charging the first node N1 to switch off the output circuit 200 under the control of the electric level of the first node N1.

It should be noted that the detailed description and the technical effects of the driving method may refer to the description on the working principle of the shift register unit 10 provided by the embodiment of the present disclosure. No further description will be given here.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A shift register unit, comprising: an input circuit, an output circuit, a reset circuit, a control circuit and a reset stabilizing circuit, wherein the input circuit is configured to write an input signal into a first node in response to an input start signal; the output circuit is configured to output a preparatory output signal to an output terminal under control of an electric level of the first node; the reset circuit is configured to reset the output terminal under control of an electric level of a second node; the control circuit is configured to apply a first voltage signal to the second node in response to a control signal; and the reset stabilizing circuit is configured to apply a second voltage signal to the first node in response to a reset stabilizing signal; further comprising an output stabilizing circuit, wherein the output stabilizing circuit is configured to be switched on or off, according to a change in an electrical level of a signal outputted by the output terminal, under control of the first voltage signal.

2. The shift register unit according to claim 1, wherein the reset stabilizing circuit comprises a first transistor and a second transistor, and the reset stabilizing signal comprises a first reset stabilizing signal and a second reset stabilizing signal;

a gate electrode of the first transistor is configured to be connected with the second node to take the electric level of the second node as the first reset stabilizing signal, a first terminal of the first transistor is configured to be connected with a first clock signal line to receive a first clock signal as the second reset stabilizing signal, and a second terminal of the first transistor is configured to be connected with a gate electrode of the second transistor; and a first terminal of the second transistor is configured to be connected with a second voltage terminal to receive the second voltage signal, and a second terminal of the second transistor is configured to be connected with the first node.

3. The shift register unit according to claim 1, wherein the reset stabilizing circuit comprises a third transistor and a fourth transistor, and the reset stabilizing signal comprises a first reset stabilizing signal and a second reset stabilizing signal;
  a gate electrode of the third transistor is configured to be connected with the second node to take the electric level of the second node as the first reset stabilizing signal, a first terminal of the third transistor is configured to be connected with a second voltage terminal to receive the second voltage signal, and a second terminal of the third transistor is configured to be connected with a first terminal of the fourth transistor; and
  a gate electrode of the fourth transistor is configured to be connected with a first clock signal line to receive a first clock signal as the second reset stabilizing signal, and a second terminal of the fourth transistor is configured to be connected with the first node.

4. The shift register unit according to claim 1, wherein the input circuit comprises a fifth transistor; and
  a gate electrode of the fifth transistor is configured to be connected with a second clock signal line to receive a second clock signal as the input start signal, a first terminal of the fifth transistor is configured to be connected with an input signal line to receive the input signal, and a second terminal of the fifth transistor is configured to be connected with the first node.

5. The shift register unit according to claim 1, wherein the output circuit comprises a sixth transistor and a first capacitor;
  a gate electrode of the sixth transistor is configured to be connected with the first node, a first terminal of the sixth transistor is configured to be connected with a first clock signal line to receive a first clock signal as the preparatory output signal, and a second terminal of the sixth transistor is taken as the output terminal; and
  a first electrode of the first capacitor is configured to be connected with the gate electrode of the sixth transistor, and a second electrode of the first capacitor is configured to be connected with the second terminal of the sixth transistor.

6. The shift register unit according to claim 1, wherein the reset circuit comprises a seventh transistor and a second capacitor;
  a gate electrode of the seventh transistor is configured to be connected with the second node, a first terminal of the seventh transistor is configured to be connected with a second voltage terminal to receive the second voltage signal, and a second terminal of the seventh transistor is configured to be connected with the output terminal; and
  a first electrode of the second capacitor is configured to be connected with the gate electrode of the seventh transistor, and a second electrode of the second capacitor is configured to be connected with the first terminal of the seventh transistor.

7. The shift register unit according to claim 1, wherein the control circuit comprises an eighth transistor and a ninth transistor, and the control signal comprises a first control signal and a second control signal;
  a gate electrode of the eighth transistor is configured to be connected with a second clock signal line to receive a second clock signal as the first control signal, a first terminal of the eighth transistor is configured to be connected with a first voltage terminal to receive the first voltage signal, and a second terminal of the eighth transistor is configured to be connected with the second node; and
  a gate electrode of the ninth transistor is configured to be connected with the input circuit to receive the input signal inputted from the input circuit and take the input signal as the second control signal, a first terminal of the ninth transistor is configured to be connected with the second clock signal line to receive the second clock signal, and a second terminal of the ninth transistor is configured to be connected with the second terminal of the eighth transistor.

8. The shift register unit according to claim 1, wherein the output stabilizing circuit comprises a tenth transistor; and a gate electrode of the tenth transistor is configured to be connected with a first voltage terminal to receive the first voltage signal, a first terminal of the tenth transistor is configured to be connected with the input circuit and the reset stabilizing circuit, and a second terminal of the tenth transistor is configured to be connected with the first node.

9. The shift register unit according to claim 1, wherein transistors of the shift register unit are P-type transistors, and a material of an active layer of each of the P-type transistors comprises low-temperature polysilicon.

10. The shift register unit according to claim 1, further comprising an output stabilizing circuit,
  wherein the output stabilizing circuit comprises an output stabilizing transistor, a gate electrode of the output stabilizing transistor is configured to be connected with a second voltage terminal to receive the second voltage signal, a first terminal of the output stabilizing transistor is configured to be connected with the input circuit and the reset stabilizing circuit, and a second terminal of the output stabilizing transistor is configured to be connected with the first node; and
  the output stabilizing transistor is an N-type transistor, and a material of an active layer of the N-type transistor comprises an oxide; and
  transistors, except for the output stabilizing transistor, of the shift register unit are P-type transistors; and a material of an active layer of each of the P-type transistors comprises low-temperature polysilicon.

11. The shift register unit according to claim 1, wherein,
  when the control circuit comprises a ninth transistor and the output stabilizing circuit comprises a tenth transistor, the ninth transistor and the tenth transistor are dual-gate thin-film transistors; or
  when the control circuit comprises a ninth transistor and the output stabilizing circuit comprises an output stabilizing transistor, the ninth transistor and the output stabilizing transistor are dual-gate thin-film transistors.

12. A shift register unit, comprising:
  an eleventh transistor, wherein a gate electrode of the eleventh transistor is configured to be connected with a first node, a first terminal of the eleventh transistor is configured to be connected with a first clock signal line to receive a first clock signal, and a second terminal of the eleventh transistor is configured to be connected with an output terminal;
  a third capacitor, wherein a first electrode of the third capacitor is configured to be connected with the gate electrode of the eleventh transistor, and a second electrode of the third capacitor is configured to be connected with the second terminal of the eleventh transistor;

a twelfth transistor, wherein a gate electrode of the twelfth transistor is configured to be connected with a first voltage terminal to receive a first voltage signal, the twelfth transistor further comprises a first terminal and a second terminal, and the second terminal of the twelfth transistor is configured to be connected with the first node;

a thirteenth transistor, wherein a gate electrode of the thirteenth transistor is configured to be connected with a second clock signal to receive a second clock signal, a first terminal of the thirteenth transistor is configured to be connected with an input terminal to receive an input signal, and a second terminal of the thirteenth transistor is configured to be connected with the first terminal of the twelfth transistor;

a fourteenth transistor, wherein a gate electrode of the fourteenth transistor is configured to be connected with a second node, a first terminal of the fourteenth transistor is configured to be connected with a second voltage terminal to receive a second voltage signal, and a second terminal of the fourteenth transistor is configured to be connected with the second terminal of the eleventh transistor;

a fourth capacitor, wherein a first electrode of the fourth capacitor is configured to be connected with the gate electrode of the fourteenth transistor, and a second electrode of the fourth capacitor is configured to be connected with the first terminal of the fourteenth transistor;

a fifteenth transistor, wherein a gate electrode of the fifteenth transistor is configured to be connected with the second node, and a first terminal of the fifteenth transistor is configured to be connected with the first clock signal line to receive the first clock signal;

a sixteenth transistor, wherein a gate electrode of the sixteenth transistor is configured to be connected with the second terminal of the fifteenth transistor, a first terminal of the sixteenth transistor is configured to be connected with the second voltage terminal to receive the second voltage signal, and a second terminal of the sixteenth transistor is configured to be connected with the first terminal of the twelfth transistor;

a seventeenth transistor, wherein a gate electrode of the seventeenth transistor is configured to be connected with the second clock signal line to receive the second clock signal, a first terminal of the seventeenth transistor is configured to be connected with the first voltage terminal to receive the first voltage signal, and a second terminal of the seventeenth transistor is configured to be connected with the second node; and an eighteenth transistor, wherein a gate electrode of the eighteenth transistor is configured to be connected with the second terminal of the thirteenth transistor, a first terminal of the eighteenth transistor is configured to be connected with the second clock signal line to receive the second clock signal, and a second terminal of the eighteenth transistor is configured to be connected with the second node.

13. A shift register unit, comprising:

a nineteenth transistor, wherein a gate electrode of the nineteenth transistor is configured to be connected with a first node, a first terminal of the nineteenth transistor is configured to be connected with a first clock signal line to receive a first clock signal, and a second terminal of the nineteenth transistor is configured to be connected with an output terminal;

a fifth capacitor, wherein a first electrode of the fifth capacitor is configured to be connected with the gate electrode of the nineteenth transistor, and a second electrode of the fifth capacitor is configured to be connected with the second terminal of the nineteenth transistor;

a twentieth transistor, wherein a gate electrode of the twentieth transistor is configured to be connected with a first voltage terminal to receive a first voltage signal, the twentieth transistor further comprises a first terminal and a second terminal, and the second terminal of the twentieth transistor is configured to be connected with the first node;

a twenty-first transistor, wherein a gate electrode of the twenty-first transistor is configured to be connected with a second clock signal line to receive a second clock signal, a first terminal of the twenty-first transistor is configured to be connected with an input terminal to receive an input signal, and a second terminal of the twenty-first transistor is configured to be connected with the first terminal of the twentieth transistor;

a twenty-second transistor, wherein a gate electrode of the twenty-second transistor is configured to be connected with a second node, a first terminal of the twenty-second transistor is configured to be connected with a second voltage terminal to receive a second voltage signal, and a second terminal of the twenty-second transistor is configured to be connected with the second terminal of the nineteenth transistor;

a sixth capacitor, wherein a first electrode of the sixth capacitor is configured to be connected with the gate electrode of the twenty-second transistor, and a second electrode of the sixth capacitor is configured to be connected with the first terminal of the twenty-second transistor;

a twenty-third transistor, wherein a gate electrode of the twenty-third transistor is configured to be connected with the second node, and a first terminal of the twenty-third transistor is configured to be connected with the second voltage terminal to receive the second voltage signal;

a twenty-fourth transistor, wherein a gate electrode of the twenty-fourth transistor is configured to be connected with the first clock signal line to receive the first clock signal, a first terminal of the twenty-fourth transistor is configured to be connected with the second terminal of the twenty-third transistor, and a second terminal of the twenty-fourth transistor is configured to be connected with the first terminal of the twentieth transistor;

a twenty-fifth transistor, wherein a gate electrode of the twenty-fifth transistor is configured to be connected with the second clock signal line to receive the second clock signal, a first terminal of the twenty-fifth transistor is configured to be connected with the first voltage terminal to receive the first voltage signal, and a second terminal of the twenty-fifth transistor is configured to be connected with the second node; and a twenty-sixth transistor, wherein a gate electrode of the twenty-sixth transistor is configured to be connected with the second terminal of the twenty-first transistor, a first terminal of the twenty-sixth transistor is configured to be connected with the second clock signal line to receive the second clock signal, and a second terminal of the twenty-sixth transistor is configured to be connected with the second node.

14. A gate drive circuit, comprising a plurality of shift register units that are cascaded, wherein the plurality of shift register units comprise P first shift register units, each of the first shift register units adopts the shift register unit according to claim 1, and P is an integer greater than one.

15. A display device, comprising the gate drive circuit according to claim 14.

16. The display device according to claim 15, further comprising a plurality of scanning lines and a plurality of pixel units arranged in a plurality of rows,
- wherein the plurality of scanning lines are correspondingly connected with the plurality of rows of pixel units;
- output terminals of the plurality of shift register units in the gate drive circuit are correspondingly connected with the plurality of scanning lines; and
- an output terminal of a shift register unit at (N)th stage is further connected with an input circuit of a shift register unit at (N+1)th stage to provide an input signal, and N is an integer greater than zero.

17. A gate drive circuit, comprising a plurality of shift register units that are cascaded,
- wherein the plurality of shift register units comprise P first shift register units, each of the first shift register units adopts the shift register unit according to claim 12, and P is an integer greater than one.

18. A display device, comprising the gate drive circuit according to claim 17.

19. A gate drive circuit, comprising a plurality of shift register units that are cascaded,
- wherein the plurality of shift register units comprise P first shift register units, each of the first shift register units adopts the shift register unit according to claim 13, and P is an integer greater than one.

* * * * *